(12) United States Patent
Maeda

(10) Patent No.: US 8,049,891 B2
(45) Date of Patent: Nov. 1, 2011

(54) ADJUSTMENT METHOD FOR POSITION DETECTION APPARATUS, EXPOSURE APPARATUS, AND DEVICE FABRICATION METHOD

(75) Inventor: Hironori Maeda, Utsunomiya (JP)

(73) Assignee: Canon Kabushiki Kaisha (JP)

(*) Notice: Subject to any disclaimer, the term of this patent is extended or adjusted under 35 U.S.C. 154(b) by 307 days.

(21) Appl. No.: 12/169,029

(22) Filed: Jul. 8, 2008

(65) Prior Publication Data
US 2009/0015836 A1    Jan. 15, 2009

(30) Foreign Application Priority Data
Jul. 9, 2007   (JP) .................... 2007-180152

(51) Int. Cl.
G01B 11/00    (2006.01)
G01B 9/00     (2006.01)
G01B 11/14    (2006.01)
(52) U.S. Cl. .................. 356/400; 356/124; 356/614
(58) Field of Classification Search .............. None
See application file for complete search history.

(56) References Cited

U.S. PATENT DOCUMENTS

| | | | |
|---|---|---|---|
| 5,680,200 A * | 10/1997 | Sugaya et al. | 355/53 |
| 6,538,740 B1 * | 3/2003 | Shiraishi et al. | 356/401 |
| 6,885,450 B2 * | 4/2005 | Fukui | 356/401 |
| 6,975,399 B2 * | 12/2005 | Fukui | 356/401 |
| 7,456,967 B2 * | 11/2008 | Fukui et al. | 356/401 |
| 7,528,954 B2 * | 5/2009 | Fukui | 356/401 |
| 7,580,116 B2 * | 8/2009 | Maeda | 355/68 |
| 2002/0060793 A1 * | 5/2002 | Fukui | 356/400 |
| 2009/0115985 A1 * | 5/2009 | Maeda | 355/55 |
| 2009/0231569 A1 * | 9/2009 | Maeda | 355/77 |

FOREIGN PATENT DOCUMENTS
JP           09-167738 A     6/1997
* cited by examiner Primary Examiner — Tarifur Chowdhury
Assistant Examiner — Gordon J Stock, Jr.
(74) Attorney, Agent, or Firm — Rossi, Kimms & McDowell LLP

(57) ABSTRACT

The present invention provides an adjustment method for a position detection apparatus which comprises an optical system including first and second optical members whose positions can be changed, and detects a position of an object, comprising the steps of calculating a value representing an asymmetry of a detection signal of a light which enters a photoelectric conversion device via the optical system, for each of a plurality of positions of the first optical member in a direction perpendicular to an optical axis of the optical system, specifying a position of the object in the direction of the optical axis, at which the value is insensitive, for each of the plurality of positions, and adjusting a position of the second optical member in the direction perpendicular to the optical axis based on the value at the position of the object specified in the specifying step.

15 Claims, 22 Drawing Sheets

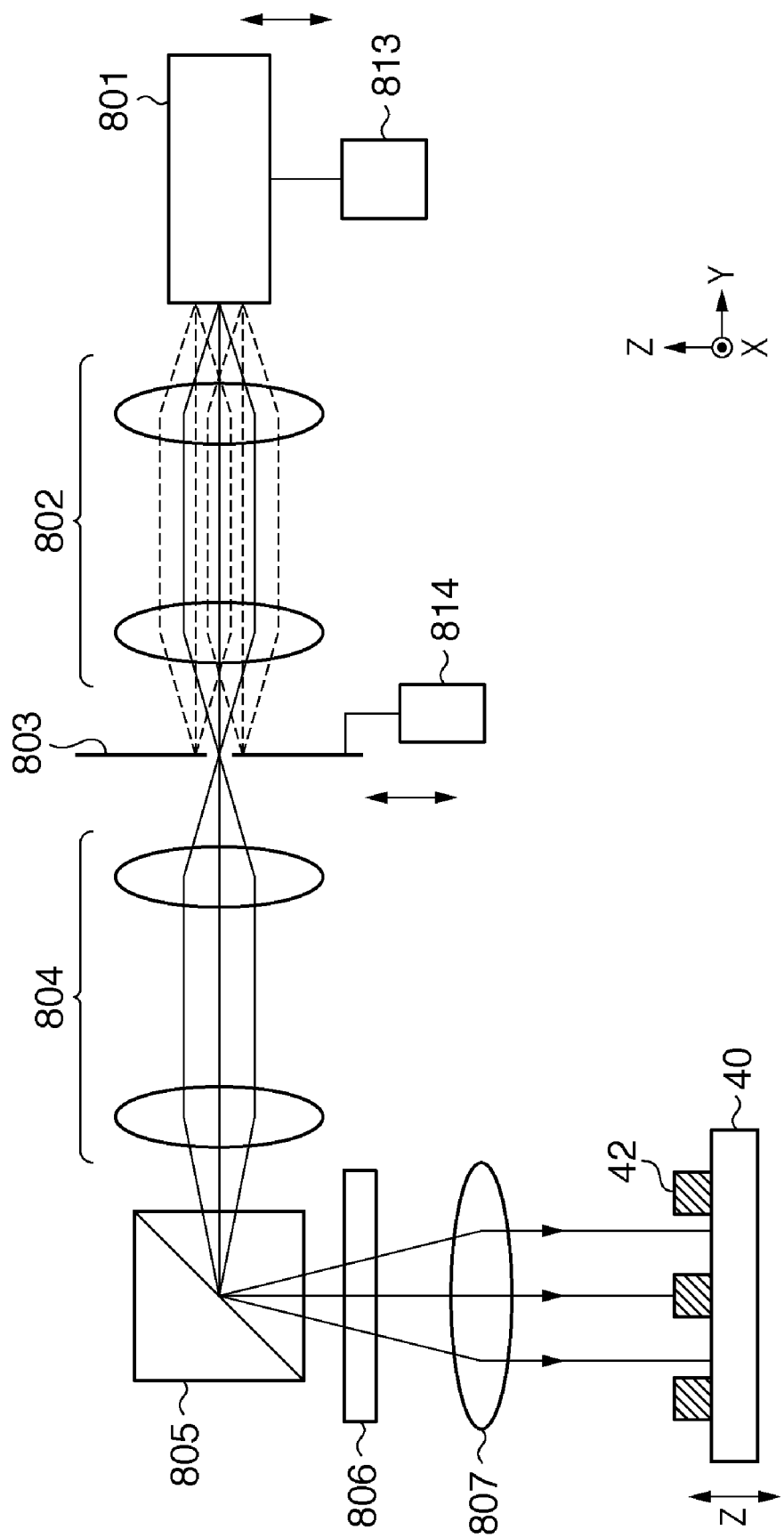

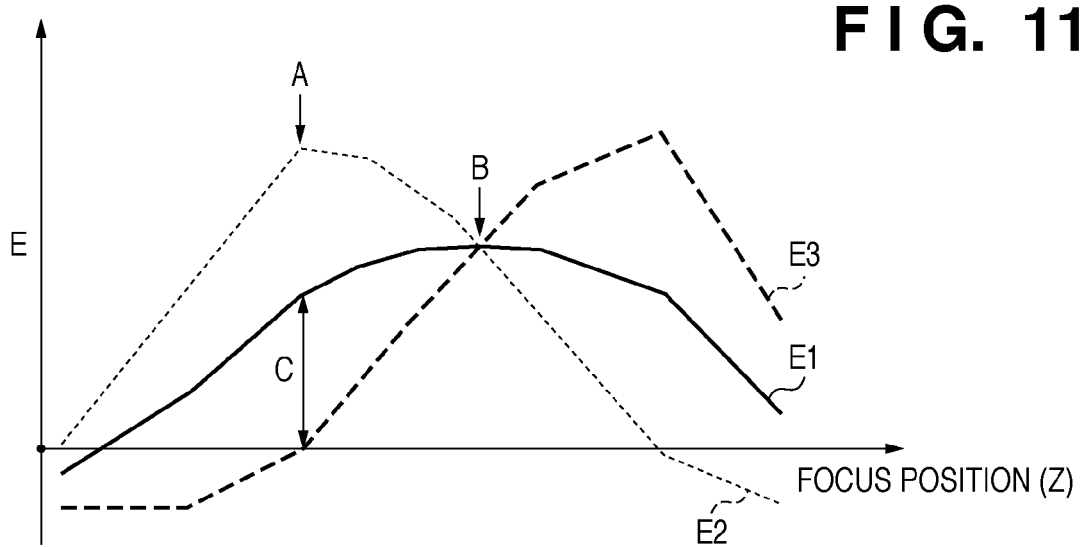
F I G. 11
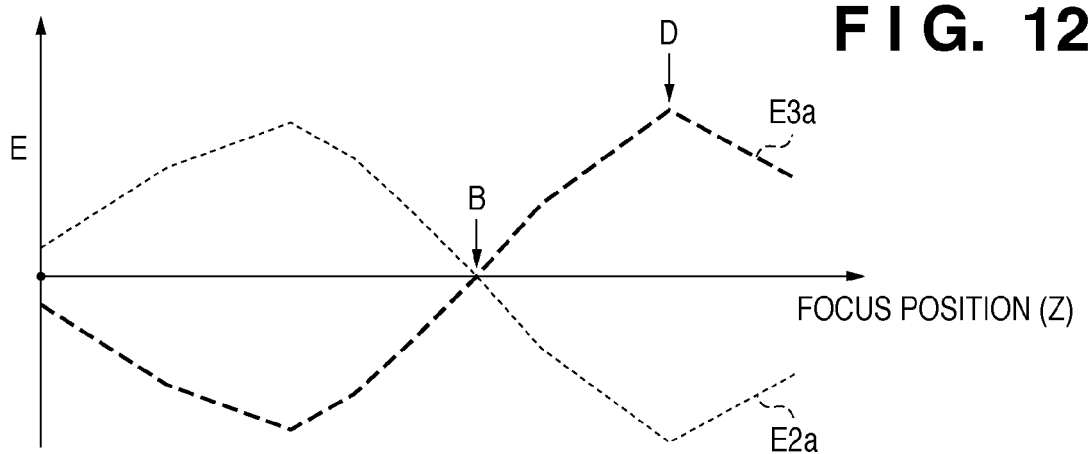
F I G. 12
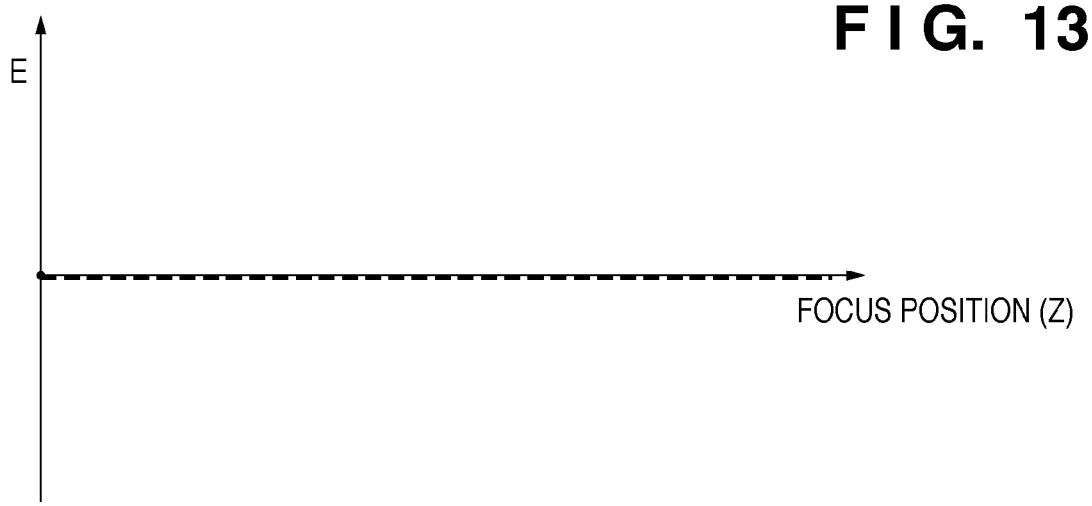
F I G. 13

F I G. 22
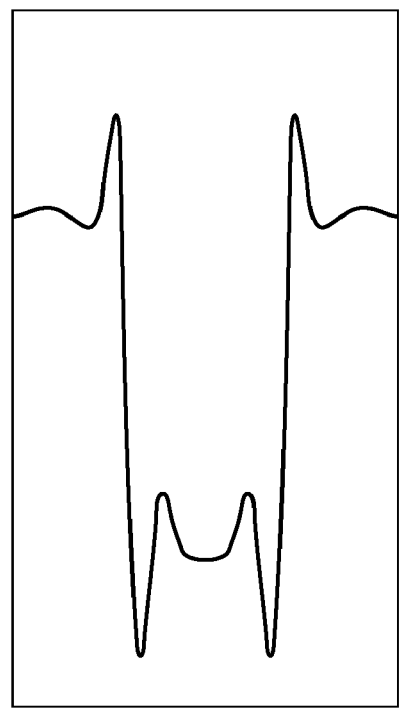
F I G. 23
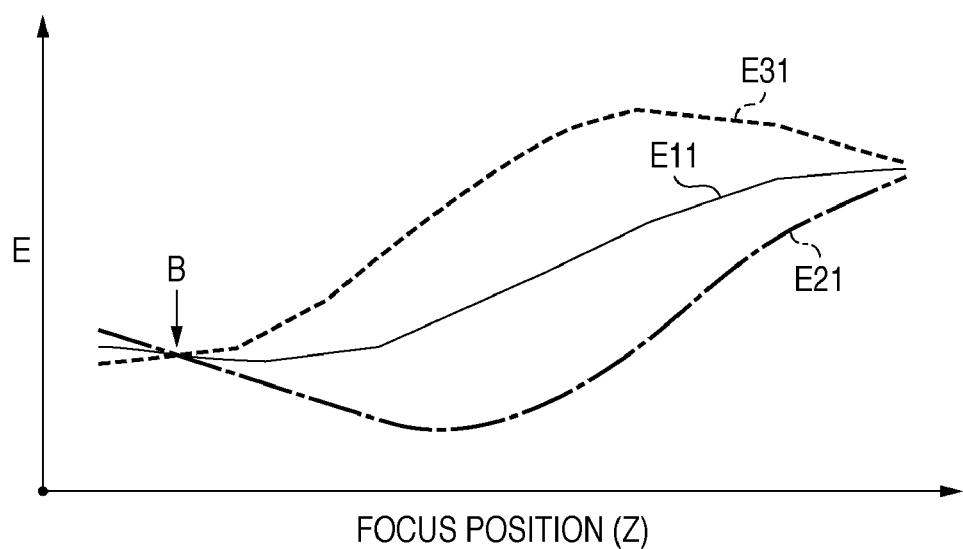

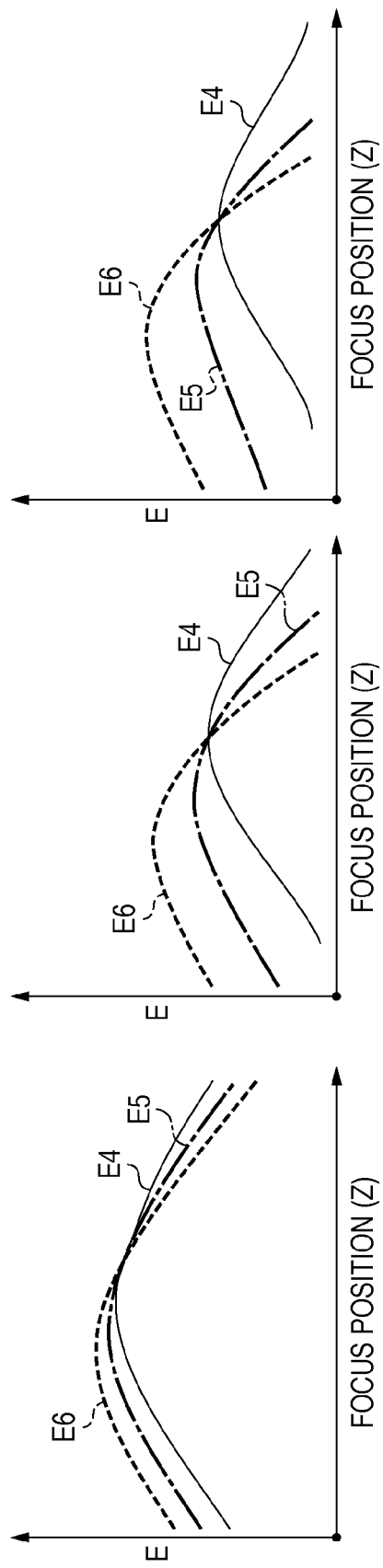

ADJUSTMENT METHOD FOR POSITION DETECTION APPARATUS, EXPOSURE APPARATUS, AND DEVICE FABRICATION METHOD

BACKGROUND OF THE INVENTION

1. Field of the Invention

The present invention relates to an adjustment method for a position detection apparatus, an exposure apparatus, and a device fabrication method.

2. Description of the Related Art

A projection exposure apparatus which projects and transfers a circuit pattern formed on a reticle (mask) onto, for example, a wafer via a projection optical system has conventionally been employed to fabricate a semiconductor device using photolithography.

Along with the micropatterning of semiconductor devices, the projection exposure apparatus is required to transfer a reticle pattern onto a wafer by exposure with a higher resolving power. A minimum line width (resolution) that the projection exposure apparatus can transfer is proportional to the wavelength of exposure light and is inversely proportional to the numerical aperture (NA) of the projection optical system. In view of this, the wavelength of the exposure light is shortening and the NA of the projection optical system is increasing.

An exposure light source has currently shifted from a superhigh pressure mercury lamp (i-line (wavelength: about 365 nm)) to a KrF excimer laser (wavelength: about 248 nm) and an ArF excimer laser (wavelength: about 193 nm), and the practical application of even an $F_2$ laser (wavelength: about 157 nm) is in progress. Moreover, the adoption of EUV (Extreme Ultra Violet) light with a wavelength of about 10 nm to 15 nm is expected.

There has also been proposed immersion exposure that aims at increasing the NA of the projection optical system by filling at least part of the space between the projection optical system and the wafer with a liquid (e.g., a liquid with a refractive index higher than 1). The immersion exposure improves the resolution by increasing the NA of the projection optical system on the wafer side.

Along with such an improvement in resolution, the projection exposure apparatus is also required to improve the overlay accuracy, that is, the accuracy of overlaying several patterns on the wafer. In general, the overlay accuracy must be about ⅕ the resolution. Along with the micropatterning of semiconductor devices, it is increasingly becoming important to improve the overlay accuracy. To obtain a desired overlay accuracy, it is necessary to align the reticle and wafer with high accuracy. For this purpose, the projection exposure apparatus includes a plurality of alignment detection systems (i.e., position detection apparatuses).

Wafer alignment detection systems are roughly classified into two types, that is, the off-axis detection system and the TTL-AA (Through the Lens Auto Alignment) detection system. The off-axis detection system detects an alignment mark on the wafer without using a projection optical system. The TTL-AA detection system detects an alignment mark on the wafer with the alignment wavelength of non-exposure light via a projection optical system.

In recent years, the semiconductor device production mode is shifting from low-variety, high-volume production to high-variety, low-volume production. Along with this trend, an alignment detection system which can minimize detection errors in wafer processes under various conditions (with regard to, e.g., the material, thickness, film thickness, and line width) is demanded. For example, when the alignment detection system includes a TIS (Tool Induced Shift), it generates detection errors even when it detects an alignment mark with a symmetrical stepped structure. Detection errors are generated due to aberrations (in particular, coma aberration due to decentering) which cause TISs and remain in the optical system of the alignment detection system, and the tilt (optical axis shift) of the optical axis of this optical system. To provide an alignment detection system which can minimize detection errors in wafer processes under various conditions, it is necessary to reduce coma aberration and an optical axis shift of the optical system of the alignment detection system.

Under the circumstances, an adjustment method for an alignment detection system has been proposed, which reduces an optical axis shift by moving an optical member of the alignment detection system (adjusting the optical center of gravity) so that an asymmetrical waveform obtained upon detecting an adjustment mark becomes symmetrical. See Japanese Patent Laid-Open No. 9-167738 for details of this technique.

However, the conventional adjustment method performs the adjustment so that coma aberration and an optical axis shift of the optical system of the alignment detection system are canceled in total, so it does not reduce coma aberration and an optical axis shift of the optical system of the alignment detection system (make them close to zero).

A waveform obtained upon detecting the adjustment mark becomes asymmetrical not only due to the influence of coma aberration but also due to the influence of an optical axis shift. In some cases, the influences of coma aberration and an optical axis shift merely cancel each other even when the optical axis shift is adjusted by moving the optical member of the alignment detection system, so the coma aberration and optical axis shift which cause detection errors, in fact, remain. Consequently, the alignment detection system adjusted by the conventional adjustment method can minimize detection errors in a wafer process under a certain condition, but cannot minimize those in wafer processes under various conditions. In other words, the detection accuracy (alignment accuracy) of the alignment detection system adjusted by the conventional adjustment method changes for each wafer process.

SUMMARY OF THE INVENTION

The present invention provides an adjustment method which can reduce detection errors in wafer processes under various conditions by independently adjusting coma aberration and an optical axis shift of an optical system with high accuracy in a position detection apparatus such as an alignment detection system.

According to one aspect of the present invention, there is provided an adjustment method for a position detection apparatus which comprises an optical system including a first optical member and second optical member whose positions can be changed, and is configured to detect a position of a detection object, comprises the steps of setting a plurality of different positions to position the first optical member in a direction perpendicular to an optical axis of the optical system, detecting light which enters a photoelectric conversion device via the optical system, while relatively moving the detection object in a direction of the optical axis, for each of the plurality of positions set in the step of setting, calculating an evaluation value representing an asymmetry of a detection signal of the light, which is detected in the step of detecting, for each of the plurality of positions, specifying a position of the detection object in the direction of the optical axis, at which the evaluation value calculated in the step of calculating is insensitive, for each of the plurality of positions, and adjusting a position of the second optical member in the direction perpendicular to the optical axis based on the evaluation value at the position of the detection object in the direction of the optical axis specified in the step of specifying.

According to another aspect of the present invention, there is provided an exposure apparatus comprises an illumination optical system configured to illuminate a reticle with a light beam from a light source, a projection optical system configured to project a pattern of the reticle onto a substrate, and a position detection apparatus which comprises an optical system including a first optical member and second optical member whose positions can be changed, and is configured to detect at least one of a position of the reticle and a position of the substrate, the position detection apparatus comprises a setting unit configured to set a plurality of different positions to position the first optical member in a direction perpendicular to an optical axis of the optical system, a detection unit configured to detect light which enters a photoelectric conversion device via the optical system, while relatively moving a mark representing the at least one of the position of the reticle and the position of the substrate in a direction of the optical axis, for each of the plurality of positions set by the setting unit, a calculation unit configured to calculate an evaluation value representing an asymmetry of a detection signal of the light, which is detected by the detection unit, for each of the plurality of positions, a specifying unit configured to specify a position of the detection object in the direction of the optical axis, at which the evaluation value calculated by the calculation unit is insensitive, for each of the plurality of positions, and an adjusting unit configured to adjust a position of the second optical member in the direction perpendicular to the optical axis based on the evaluation value at the position of the detection object in the direction of the optical axis specified by the specifying unit.

According to yet another aspect of the present invention, there is provided a device fabrication method comprises the steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIGS. 6A and 6B are charts showing an example of detection waveforms when the wafer alignment detection system has detected the wafer alignment mark shown in FIG. 5, in which FIG. 6A is a chart showing an asymmetrical detection waveform, and FIG. 6B is a chart showing a symmetrical detection waveform.

FIG. 7 is a schematic sectional view illustrating a case in which the wafer alignment detection system shown in FIG. 3 has no optical axis shift.

FIG. 11 is a graph showing the relationship between the waveform asymmetry after coma aberration of the wafer alignment detection system is adjusted and the focus position of the wafer alignment mark relative to the wafer alignment detection system.

FIG. 12 is a graph showing the relationship between the waveform asymmetry after coma aberration of the wafer alignment detection system is adjusted at a coma aberration adjustment focus position and the focus position of the wafer alignment mark relative to the wafer alignment detection system.

FIG. 13 is a graph showing the relationship between the waveform asymmetry after an optical axis shift of the wafer alignment detection system is adjusted and the focus position of the wafer alignment mark.

FIG. 22 is a chart showing a detection waveform when the wafer alignment detection system has illuminated (detected) the resist wafer shown in FIG. 20 with an illumination $\sigma$ value of 0.4 while there is neither coma aberration nor optical axis shift (ideal state).

FIG. 23 is a graph showing the relationship between the waveform asymmetry of the detection waveform between its lower peaks and the focus position of the wafer alignment mark relative to the wafer alignment detection system.

FIGS. 30A to 30C are graphs showing the relationships between the waveform asymmetries between the lower peaks of detection waveforms obtained by illuminating (detecting) a wafer alignment mark having a step of λ/8 with three illumination σ values and the focus position of the wafer alignment mark.

DESCRIPTION OF THE EMBODIMENT

Figure 1:
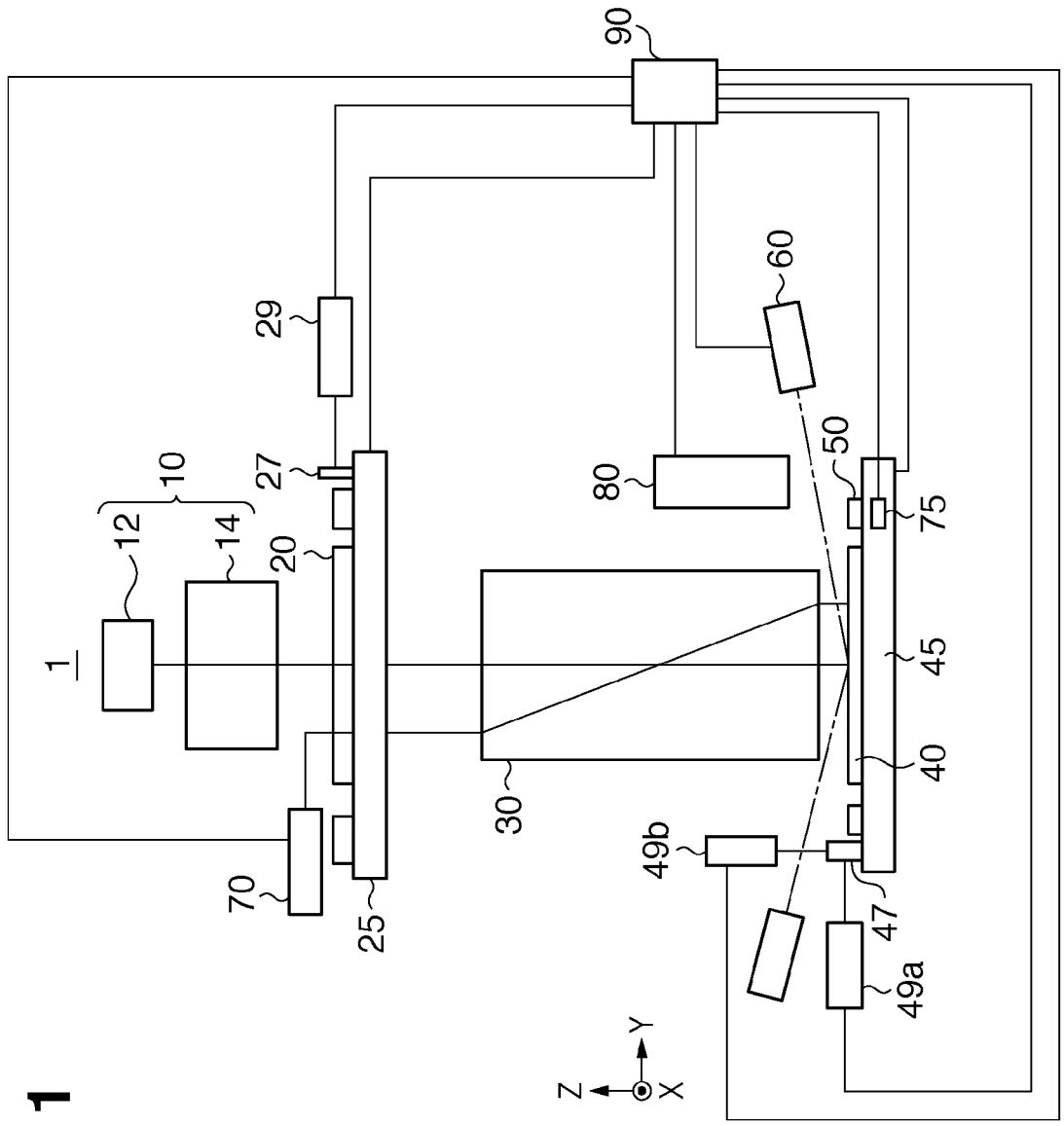
FIG. 1 is a schematic block diagram showing an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic block diagram showing the arrangement of an exposure apparatus 1 according to one aspect of the present invention. In this embodiment, the exposure apparatus 1 is a scanning exposure apparatus (scanner) which transfers the pattern of a reticle 20 onto a wafer 40 by exposure while synchronously scanning the reticle 20 and wafer 40 in the scanning direction. However, the exposure apparatus 1 may be a projection exposure apparatus (stepper) which transfers the pattern of the reticle 20 onto the wafer 40 by exposure while the reticle 20 is fixed.

As shown in FIG. 1, the exposure apparatus 1 includes an illumination apparatus 10, a reticle stage 25 for supporting the reticle 20, a projection optical system 30, and a wafer stage 45 for supporting the wafer 40. The exposure apparatus 1 also includes a stage reference plate 50, focus detection system 60, reticle alignment detection systems 70 and 75, wafer alignment detection system 80, and control unit 90. In the following description, a direction parallel to the optical axis of the projection optical system 30 is defined as the Z-axis direction, the scanning direction of the reticle 20 and wafer 40 on a plane perpendicular to the Z-axis direction is defined as the Y-axis direction, and a direction (non-scanning direction) perpendicular to the Z- and Y-axis directions is defined as the X-axis direction. The rotation directions about the X-, Y-, and Z-axes are defined as the θX, θY, and θZ directions, respectively.

The illumination apparatus 10 illuminates the reticle 20 on which a circuit pattern to be transferred is formed, and includes a light source 12 and illumination optical system 14.

The light source 12 is, for example, an excimer laser such as a KrF excimer laser with a wavelength of about 248 nm or an ArF excimer laser with a wavelength of about 193 nm. However, the light source 12 is not particularly limited to an excimer laser, and may be, for example, an $F_2$ laser with a wavelength of about 157 nm.

The illumination optical system 14 illuminates the reticle 20 with a light beam from the light source 12. In this embodiment, the illumination optical system 14 illuminates a predetermined illumination region on the reticle 20 with light (exposure light) exhibiting a uniform illuminance distribution.

The reticle 20 has a circuit pattern and is supported and driven by the reticle stage 25. Diffracted light generated by the reticle 20 is projected onto the wafer 40 via the projection optical system 30.

The reticle stage 25 supports the reticle 20. In this embodiment, the reticle stage 25 can finely, two-dimensionally move on a plane perpendicular to the optical axis of the projection optical system 30, that is, on the X-Y plane and can finely rotate in the θZ direction. Although the reticle stage 25 is drivable about at least one axis, it is preferably drivable about six axes. The reticle stage 25 is driven by a reticle stage driving mechanism such as a linear motor.

A mirror 27 is arranged on the reticle stage 25. A laser interferometer 29 for measuring the position of the mirror 27 in the X- and Y-axis directions is arranged to oppose the mirror 27. The rotation angle and position, in the two-dimensional direction, of the reticle 20 supported by the reticle stage 25 are measured in real time by the laser interferometer 29. The measurement result obtained by the laser interferometer 29 is output to the control unit 90.

The projection optical system 30 includes a plurality of optical elements and projects the pattern of the reticle 20 onto the wafer 40 with a predetermined projection magnification β. In this embodiment, the projection optical system 30 is a reduction projection optical system with a projection magnification of, for example, ¼ or ⅕.

The wafer 40 is a substrate onto which the pattern of the reticle 20 is projected (transferred). However, it is also possible to use a glass plate or another substrate in place of the wafer 40. The wafer 40 is coated with a resist (photosensitive agent).

The wafer stage 45 supports and drives the wafer 40. In this embodiment, the wafer stage 45 includes a Z stage for holding the wafer 40 via a wafer chuck, an X-Y stage for supporting the Z stage, and a base for supporting the X-Y stage. The wafer stage 45 is driven by a wafer stage driving mechanism such as a linear motor.

A mirror 47 is arranged on the wafer stage 45. A laser interferometer 49a for measuring the position of the mirror 47 in the X- and Y-axis directions and a laser interferometer 49b for measuring the position of the mirror 47 in the Z-axis direction are arranged to oppose the mirror 47. The position of the wafer stage 45 in the X- and Y-axis directions and θZ direction is measured in real time by the laser interferometer 49a. The position of the wafer stage 45 in the Z-axis direction and θX and θY directions is measured in real time by the laser interferometer 49b. The measurement results obtained by the laser interferometers 49a and 49b are output to the control unit 90.

Figure 2:
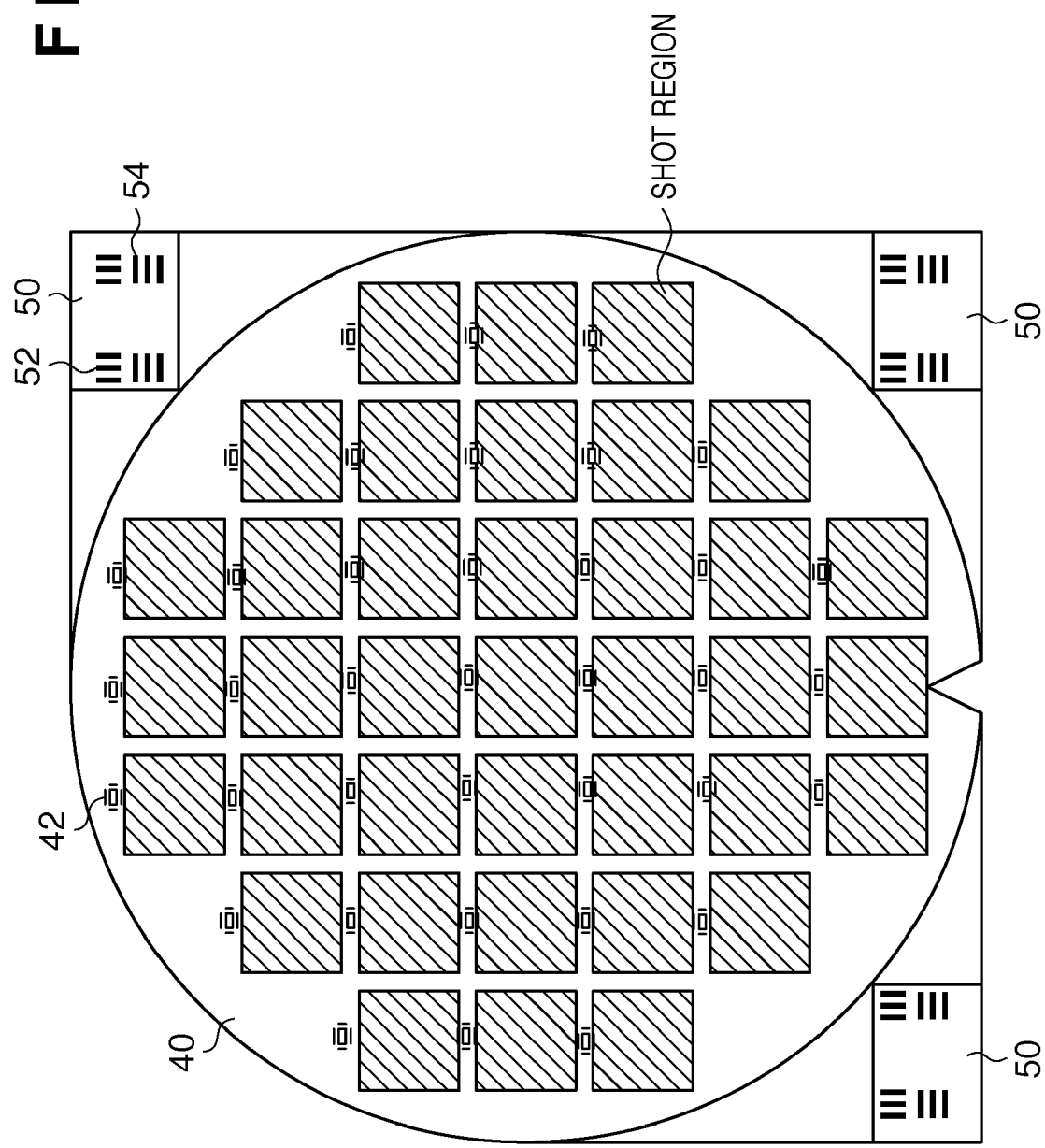
FIG. 2 is a view showing the arrangement of a stage reference plate arranged on a wafer stage of the exposure apparatus shown in FIG. 1.

The stage reference plate 50 is arranged at the corner on the wafer stage 45. FIG. 2 is a view showing the arrangement of the stage reference plate 50 on the wafer stage 45. The stage reference plate 50 is nearly flush with the surface of the wafer 40. As shown in FIG. 2, the stage reference plate 50 has a reticle alignment detection system reference mark 52 detected by the reticle alignment detection system 70 (or reticle alignment detection system 75). The stage reference plate 50 also has a wafer alignment detection system reference mark 54 detected by the wafer alignment detection system 80.

A stage reference plate 50 may be arranged at one corner on the wafer stage 45, or stage reference plates 50 may be arranged at a plurality of corners on the wafer stage 45. The stage reference plate 50 may have a plurality of reticle alignment detection system reference marks 52 and a plurality of wafer alignment detection system reference marks 54. A predetermined positional relationship (along the X- and Y-axis directions) is set in advance between the reticle alignment detection system reference mark 52 and the wafer alignment detection system reference mark 54. The reticle alignment detection system reference mark 52 and wafer alignment detection system reference mark 54 may be a common mark.

The focus detection system 60 has a function of detecting the focus (the position in the Z-axis direction) of the wafer 40. In this embodiment, the focus detection system 60 includes a light-projecting system for projecting detection light onto the surface of the wafer 40, and a light-receiving system for receiving the detection light reflected by the surface of the wafer 40. The detection result obtained by the focus detection system 60 is output to the control unit 90.

The reticle alignment detection system 70 is arranged near the reticle stage 25. The reticle alignment detection system 70 detects a reticle reference mark (not shown) on the reticle 20 supported by the reticle stage 25. The reticle alignment detection system 70 also detects, via the projection optical system 30, the reticle alignment detection system reference mark 52 of the stage reference plate 50 arranged on the wafer stage 45.

The reticle alignment detection system 70 irradiates the reticle reference mark and reticle alignment detection system reference mark 52 using the same light source as the light source 12 which actually exposes the wafer 40, and detects the light beams reflected by these marks using a photoelectric conversion device (e.g., a CCD camera). By adjusting the focuses and positions of the reticle reference mark on the reticle 20 and the reticle alignment detection system reference mark 52 on the stage reference plate 50, the relative positional relationship between the reticle stage 25 and the wafer stage 45 can be adjusted to a desired one. The detection result obtained by the reticle alignment detection system 70 is output to the control unit 90.

The reticle alignment detection system 75 is of a transparent type and used when the reticle alignment detection system reference mark 52 is a mark of a transparent type. The reticle alignment detection system 75 irradiates the reticle reference mark and reticle alignment detection system reference mark 52 using the same light source as the light source 12, and detects the light beams transmitted by these marks by a light amount sensor. The reticle alignment detection system 75 detects the amounts of transmitted light beams while driving the wafer stage 45 in the X-axis direction (or Y-axis direction) and Z-axis direction. This makes it possible to adjust the positions and focuses of the reticle reference mark on the reticle 20 and the reticle alignment detection system reference mark 52 on the stage reference plate 50. It is therefore possible to adjust the relative positional relationship between the reticle stage 25 and the wafer stage 45 to a desired one. The detection result obtained by the reticle alignment detection system 75 is output to the control unit 90.

In this manner, either the reticle alignment detection system 70 or 75 can be used to adjust the relative positional relationship between the reticle stage 25 and the wafer stage 45 to a desired one.

The wafer alignment detection system 80 includes an optical system including a first optical member and second optical member (e.g., an illumination light source 801, aperture stop 803, or optical member 810 to be described later) whose positions can be changed, and detects the position of a detection object (e.g., an alignment mark). More specifically, the wafer alignment detection system 80 includes a light-projecting system for projecting detection light beams onto a wafer alignment mark 42 on the wafer 40 and the wafer alignment detection system reference mark 54 on the stage reference plate 50, and a light-receiving system for receiving the light beams reflected by these marks. The detection result obtained by the wafer alignment detection system 80 is output to the control unit 90.

The control unit 90 includes a CPU and memory (not shown) and controls the operation of the exposure apparatus 1. The control unit 90 is electrically connected to the reticle stage 25, laser interferometer 29, wafer stage 45, and laser interferometers 49a and 49b. The control unit 90 is also electrically connected to the focus detection system 60, reticle alignment detection system 70 (or reticle alignment detection system 75), and wafer alignment detection system 80.

Based on the measurement result obtained by the laser interferometer 29, the control unit 90 controls the reticle stage 25 (i.e., the reticle stage driving mechanism) to position the reticle 20 supported by the reticle stage 25. Based on the measurement results obtained by the laser interferometers 49a and 49b, the control unit 90 controls the wafer stage 45 (i.e., the wafer stage driving mechanism) to position the wafer 40 supported by the wafer stage 45. Based on the detection result obtained by the focus detection system 60, the control unit 90 adjusts the tilt angle and position (focus position), in the Z-axis direction, of the wafer 40 supported by the wafer stage 45. Based on the detection result obtained by the reticle alignment detection system 70 or 75, the control unit 90 aligns the reticle stage 25 and wafer stage 45. Based on the detection result obtained by the wafer alignment detection system 80, the control unit 90 drives the wafer stage 45 in the X- and Y-axis directions to adjust the position of the wafer 40 in the X- and Y-axis directions. Moreover, the control unit 90 controls adjustment processing of position detection apparatuses such as the reticle alignment detection system 70 or 75 and wafer alignment detection system 80 (to be described later) (i.e., executes an adjustment method).

Figure 3:
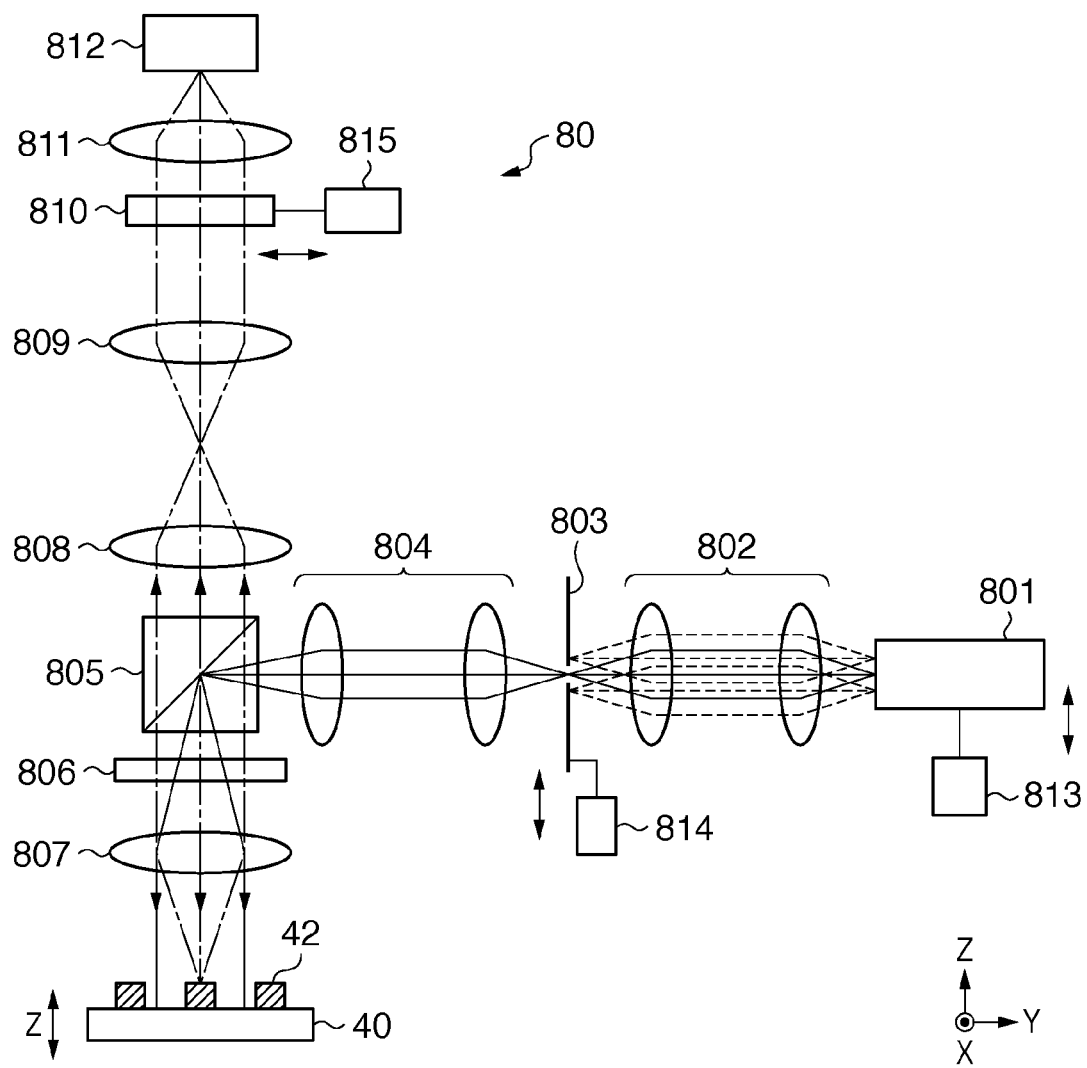
FIG. 3 is a schematic sectional view showing the detailed arrangement of a wafer alignment detection system of the exposure apparatus shown in FIG. 1.

The wafer alignment detection system 80 will be explained in detail with reference to FIG. 3. FIG. 3 is a schematic sectional view showing the detailed arrangement of the wafer alignment detection system 80. In this embodiment, the wafer alignment detection system 80 includes the illumination light source 801, a relay optical system 802, the aperture stop 803, an illumination system 804, a polarizing beam splitter 805, a λ/4 plate 806, and an objective lens 807. The illumination light source 801 includes, for example, a fiber. The wafer alignment detection system 80 also includes a relay lens 808, a first imaging optical system 809, the optical member 810 for adjusting coma aberration, a second imaging optical system 811, a photoelectric conversion device 812, and driving units 813 to 815. The driving unit 813 drives the illumination light source 801 (more specifically, the light beam exit port of the illumination light source 801) in a direction perpendicular to the optical axis of an optical system (including, e.g., the relay optical system 802 and illumination system 804 in this embodiment) of the wafer alignment detection system 80 under the control of the control unit 90. The driving unit 814 drives the aperture stop 803 (more specifically, the aperture of the aperture stop 803) in a direction perpendicular to the optical axis of an optical system (including, e.g., the relay optical system 802 and illumination system 804 in this embodiment) of the wafer alignment detection system 80 under the control of the control unit 90. The driving unit 815 drives the optical member 810 in a direction perpendicular to the optical axis of an optical system (including, e.g., the relay lens 808, first imaging optical system 809, and second imaging optical system 811 in this embodiment) of the wafer alignment detection system 80 under the control of the control unit 90. Any arrangement known to those skilled in the art is applicable to each of the driving units 813 to 815. Although the wafer alignment detection system 80 according to this embodiment includes the optical axis of an optical system including the illumination light source 801 to illumination system 804, and that of an optical system including the polarizing beam splitter 805 to photoelectric conversion device 812, they are collectively referred to as the optical axis hereinafter.

Figure 4:
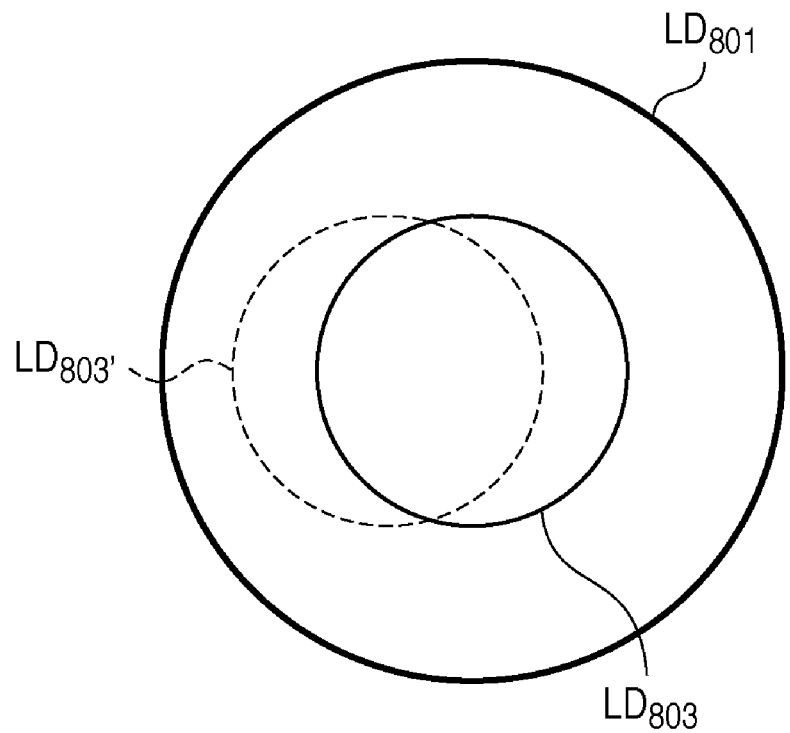
FIG. 4 is a view showing the relationship between the beam diameter in an illumination light source and that in an aperture stop in the wafer alignment detection system of the exposure apparatus shown in FIG. 1.

Referring to FIG. 3, a light beam emitted by the illumination light source 801 reaches the aperture stop 803 inserted on the pupil plane (the optical Fourier transformation plane with respect to the object plane) of the wafer alignment detection system 80, via the relay optical system 802. As shown in FIG. 4, a beam diameter $LD_{803}$ in the aperture stop 803 is sufficiently smaller than a beam diameter $LD_{801}$ in the illumination light source 801. The light beam which has reached the aperture stop 803 is guided to the polarizing beam splitter 805 via the illumination system 804. Of the light beam guided to the polarizing beam splitter 805, an S-polarized light component perpendicular to the paper surface is reflected by the polarizing beam splitter 805 and is converted into a circularly polarized light beam upon passing through the λ/4 plate 806. The light beam having passed through the λ/4 plate 806 Kohler-illuminates, via the objective lens 807, a wafer alignment mark 42 formed on the wafer 40. Note that FIG. 4 is a view showing the relationship between the beam diameter $LD_{801}$ in the illumination light source 801 and the beam diameter $LD_{803}$ in the aperture stop 803.

Reflected light, diffracted light, and scattered light from the wafer alignment mark 42 are converted into a P-polarized light beam parallel to the paper surface upon passing through the λ/4 plate 806 via the objective lens 807, and the P-polarized light beam passes through the polarizing beam splitter 805. The light beam having passed through the polarizing beam splitter 805 forms an image of the wafer alignment mark 42 on the photoelectric conversion device 812 via the relay lens 808, first imaging optical system 809, optical member 810, and second imaging optical system 811.

The wafer alignment detection system 80 detects the position of the wafer 40 based on the position of an image of the wafer alignment mark 42, which is photoelectrically converted by the photoelectric conversion device 812. When the wafer alignment detection system 80 detects the wafer alignment mark 42 on the wafer 40 with monochromatic light, an interference pattern is generated because a resist (transparent layer) is applied (formed) on the wafer alignment mark 42. This makes it impossible to detect the wafer alignment mark 42 with high accuracy because the interference pattern signal is added to the detection signal (alignment signal) output from the photoelectric conversion device 812. To solve this problem, this embodiment uses a light source with a relatively wide wavelength range as the illumination light source 801 to prevent the interference pattern signal from being added to the detection signal from the photoelectric conversion device 812.

To detect the wafer alignment mark 42 on the wafer 40 with high accuracy, it is also necessary to clearly detect an image of the wafer alignment mark 42. In other words, the wafer alignment detection system 80 needs to be focused on the wafer alignment mark 42. For this purpose, the wafer alignment detection system 80 in this embodiment includes an AF detection system (not shown), and drives the wafer alignment mark 42 to a best focus position based on the detection result obtained by the AF detection system, thereby detecting the wafer alignment mark 42.

Although the wafer alignment detection system 80 is the off-axis detection system in this embodiment, it may be the TTL-AA detection system. When the wafer alignment detection system 80 is the TTL-AA detection system, it detects the wafer alignment mark 42 via the projection optical system 30 with the same basic arrangement as that of the off-axis detection system.

Figure 5:
FIG. 5 is a schematic sectional view showing an example of a wafer alignment mark.

The adjustment of coma aberration and an optical axis shift generated in the wafer alignment detection system 80 will be explained herein. This embodiment will exemplify a case in which the wafer alignment detection system 80 detects a wafer alignment mark 42 having a step DL on its silicon (Si) surface as shown in FIG. 5. FIG. 5 is a schematic sectional view showing an example of the wafer alignment mark 42.

The adjustment of coma aberration of the wafer alignment detection system 80 will be explained first. For example, assume that the step DL of the wafer alignment mark 42 shown in FIG. 5 is set to λ/4 where λ is the wavelength of a light beam from the illumination light source 801. Assume also that an asymmetrical detection waveform as shown in FIG. 6A has been obtained at a focus position Z of the wafer alignment mark 42 by illuminating (detecting) the wafer alignment mark 42 with an illumination σ value of 0.4 by the wafer alignment detection system 80. The asymmetry of the detection waveform shown in FIG. 6A occurs due to coma aberration and an optical axis shift of the optical system of the wafer alignment detection system 80. However, this embodiment assumes that the asymmetry has occurred due to coma aberration of the optical system of the wafer alignment detection system 80. The focus position Z of the wafer alignment mark 42 is the position of the wafer alignment mark 42 relative to the wafer alignment detection system 80 in the optical axis direction.

Figure 6B:
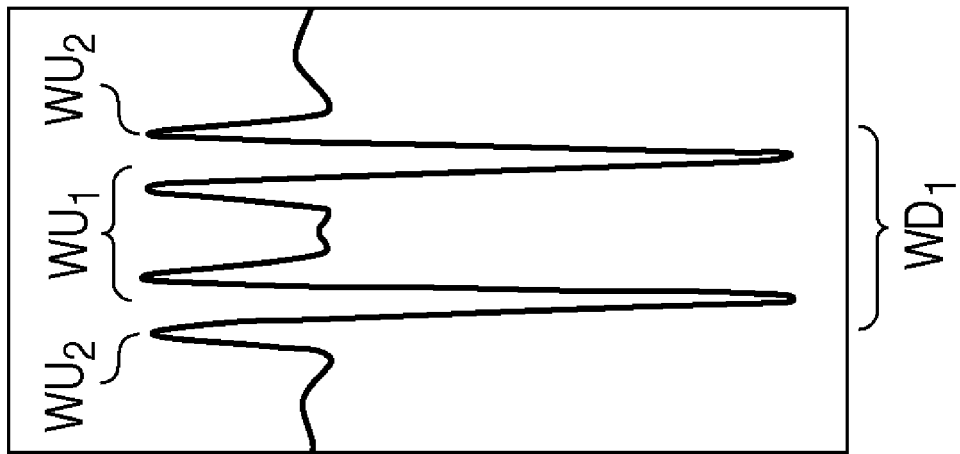
Figure 6A:
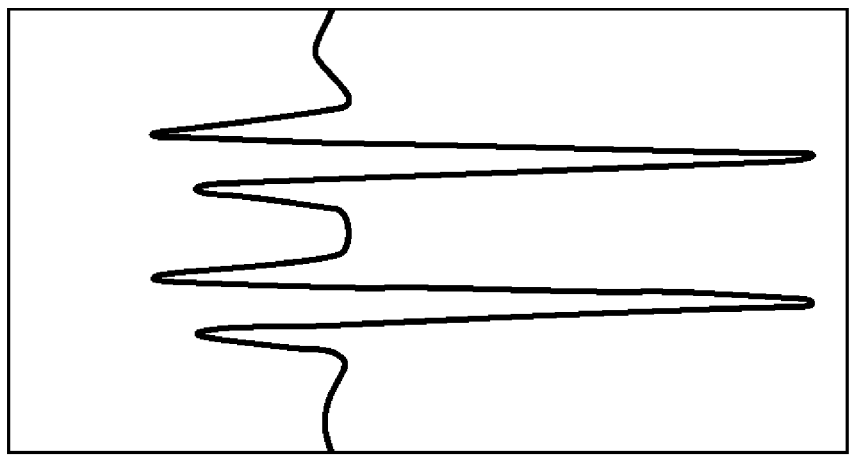

To convert the asymmetrical detection waveform as shown in FIG. 6A into a symmetrical detection waveform as shown in FIG. 6B, the optical member 810 is driven in a direction perpendicular to the optical axis via the driving unit 815 and adjust coma aberration of the overall optical system of the wafer alignment detection system 80. More specifically, the optical member 810 is driven in a direction perpendicular to the optical axis until the asymmetrical detection waveform shown in FIG. 6A is converted into the symmetrical detection waveform shown in FIG. 6B.

In this manner, coma aberration of the wafer alignment detection system 80 can be adjusted by driving the optical member 810 in a direction perpendicular to the optical axis of the optical system of the wafer alignment detection system 80.

The adjustment of an optical axis shift of the optical system of the wafer alignment detection system 80 will be explained next. If the optical system of the wafer alignment detection system 80 has no optical axis shift as shown in FIG. 7, the principal ray of a light beam from the illumination light source 801 vertically enters the wafer 40 (wafer alignment mark 42). In this case, the symmetrical detection waveform as shown in FIG. 6B is obtained as long as coma aberration of the wafer alignment detection system 80 is adjusted perfectly. FIG. 7 is a schematic sectional view illustrating a case in which the wafer alignment detection system 80 has no optical axis shift.

Figure 8:
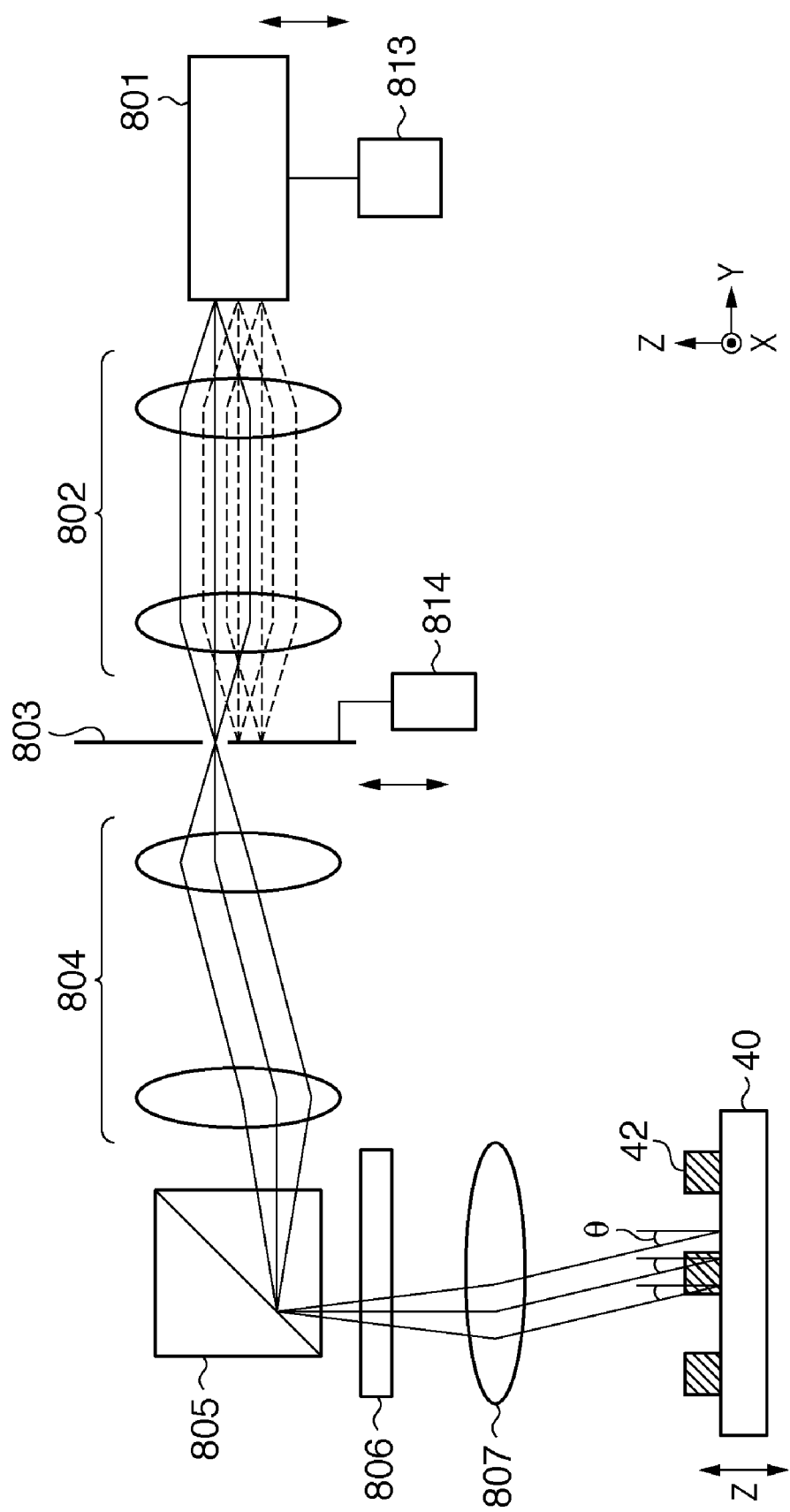
FIG. 8 is a schematic sectional view illustrating a case in which the wafer alignment detection system shown in FIG. 3 has an optical axis shift.

If the aperture stop 803 of the wafer alignment detection system 80 is shifted with respect to the optical axis as shown in FIG. 8, the principal ray of a light beam from the illumination light source 801 enters the wafer 40 not vertically but obliquely (with an angle θ). As shown in FIG. 4, the center position of a beam diameter $LD_{803}'$ in the aperture stop 803 is shifted with respect to that of the beam diameter $LD_{801}$ in the illumination light source 801. This state will be referred to as "the wafer alignment detection system 80 has an optical axis shift" hereinafter. In this case, even when coma aberration of the wafer alignment detection system 80 is adjusted perfectly, the asymmetrical detection waveform as shown in FIG. 6A is obtained by the wafer alignment detection system 80. Note that FIG. 8 is a schematic sectional view illustrating a case in which the wafer alignment detection system 80 has an optical axis shift.

In this embodiment, as shown in FIG. 8, an optical axis shift of the wafer alignment detection system 80 has been explained by taking a position shift of the aperture stop 803 as an example. However, an optical axis shift of the wafer alignment detection system 80 occurs even due to, for example, a position shift of the illumination light source 801. When the wafer alignment detection system 80 has an optical axis shift, it generates an asymmetrical detection waveform. This results in detection errors as in the case in which the wafer alignment detection system 80 has coma aberration.

When the wafer alignment detection system 80 has an optical axis shift, the illumination light source 801 or aperture stop 803 is driven in a direction perpendicular to the optical axis via the driving unit 813 or 814 and adjust the optical axis shift of the wafer alignment detection system 80. More specifically, at least one of the illumination light source 801 and the aperture stop 803 is driven in a direction perpendicular to the optical axis until the asymmetrical detection waveform shown in FIG. 6A is converted into the symmetrical detection waveform shown in FIG. 6B.

In this manner, an optical axis shift of the wafer alignment detection system 80 can be adjusted by driving the illumination light source 801 or aperture stop 803 in a direction perpendicular to the optical axis of the optical system of the wafer alignment detection system 80.

The adjustment of coma aberration and an optical axis shift of the wafer alignment detection system 80 has been described above. In practice, however, an asymmetrical detection waveform as shown in FIG. 6A is generated as coma aberration and an optical axis shift of the wafer alignment detection system 80 mix with each other. For example, assume that an asymmetrical detection waveform as shown in FIG. 6A is generated due to an optical axis shift of the wafer alignment detection system 80. In this case, the driving of the optical member 810 in a direction perpendicular to the optical axis results in the generation of coma aberration of the wafer alignment detection system 80. It is therefore necessary to identify the cause of the detection waveform asymmetry (whether the cause is coma aberration or an optical axis shift of the wafer alignment detection system 80). In other words, coma aberration and an optical axis shift of the wafer alignment detection system 80 cannot be adjusted with high accuracy unless they are adjusted separately (independently).

A method of separately (independently) adjusting coma aberration and an optical axis shift of the wafer alignment detection system 80 will be explained. A method of adjusting coma aberration at a focus position at which the detection waveform asymmetry is free from the influence of an optical axis shift of the optical system of the wafer alignment detection system 80 will be explained first.

Figure 9:
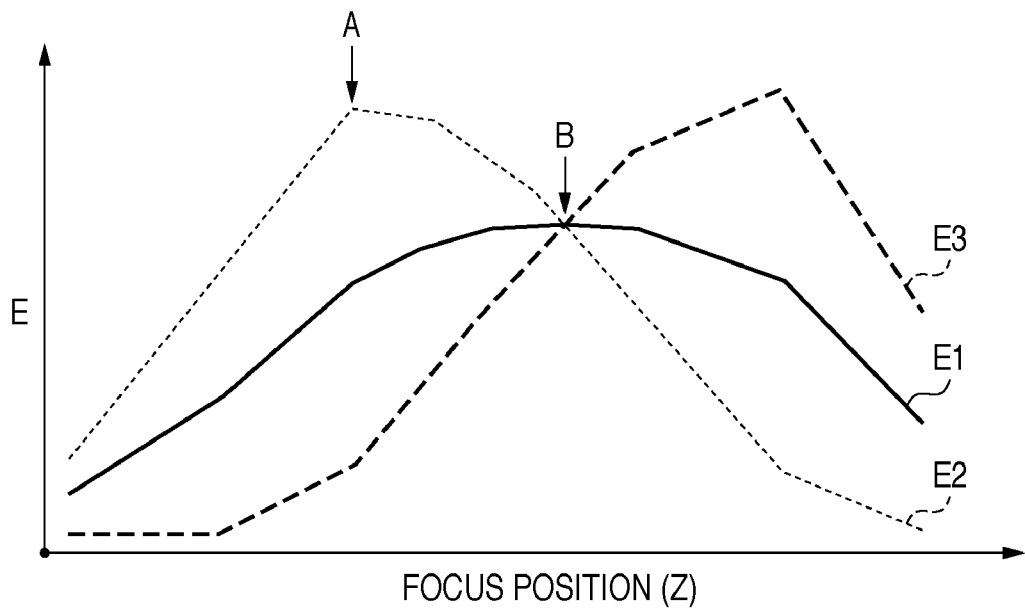
FIG. 9 is a graph showing the relationships between the waveform asymmetries of the detection waveforms shown in FIGS. 6A and 6B and the focus position of the wafer alignment mark relative to the wafer alignment detection system.
Figure 10:
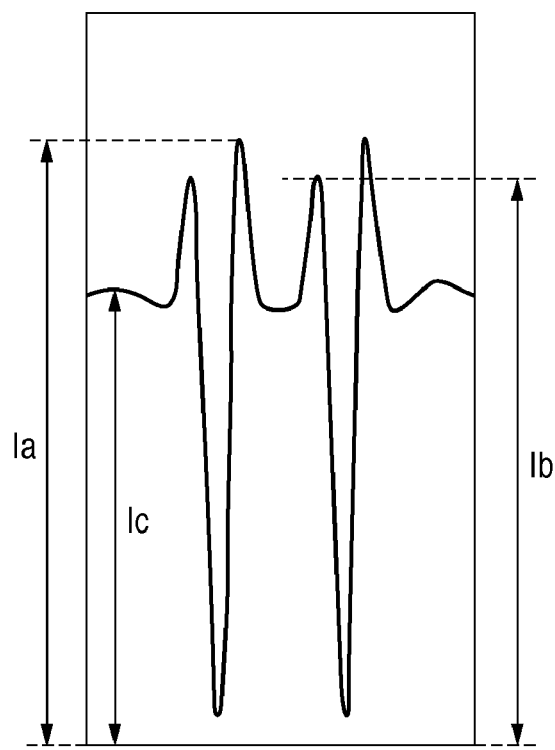
FIG. 10 is a chart for explaining the definition of the detection waveform asymmetry.

FIG. 9 is a graph showing the relationship between a waveform asymmetry E of the detection waveform shown in FIG. 6A and a focus position Z of the wafer alignment mark 42 relative to the wafer alignment detection system 80. In FIG. 9, the ordinate indicates the waveform asymmetry E, and the abscissa indicates the focus position Z. The waveform asymmetry E is an evaluation value representing the detection waveform asymmetry due to the presence of inner and outer upper peaks $WU_1$ and $WU_2$ of the detection waveform shown in FIG. 6B, i.e., the so-called shading (linking) of the edge of an image of the wafer alignment mark 42. The waveform asymmetry E is defined by (Ia−Ib)/Ic [%] where Ia is the intensity of the inner upper peak on the left side, Ib is the intensity of the inner upper peak on the right side, and Ic is the intensity of the base line in, for example, the asymmetrical detection waveform shown in FIG. 10. In other words, the waveform asymmetry E represents the difference in intensity between the upper peaks $WU_1$ and $WU_2$ of the detection waveform shown in FIG. 6B, and serves as an index of coma aberration and an optical axis shift of the wafer alignment detection system 80. Note that FIG. 10 is a chart for explaining the definition of the detection waveform asymmetry.

In FIG. 9, reference symbol E1 indicates the waveform asymmetry when the wafer alignment detection system 80 has no optical axis shift but has coma aberration alone. Reference symbol E2 indicates the waveform asymmetry when the wafer alignment detection system 80 has an optical axis shift and coma aberration in an amount equal to that in E1. Reference symbol E3 indicates the waveform asymmetry when the wafer alignment detection system 80 has an optical axis shift which has the same absolute amount as that in E2 but whose direction is opposite to that in E2, and has coma aberration in an amount equal to that in E1.

The prior art adjusts coma aberration of the optical system of the wafer alignment detection system at, for example, a focus position A. At the focus position A, when the wafer alignment detection system 80 has an optical axis shift in addition to coma aberration (E2 and E3), the waveform asymmetry changes due to the influence of the optical axis shift as compared with the case in which the wafer alignment detection system 80 has coma aberration alone (E1).

Consider the waveform asymmetry E3 when the wafer alignment detection system 80 has an optical axis shift in addition to coma aberration. In this case, even when coma aberration of the wafer alignment detection system 80 is adjusted by driving the optical member 810 in a direction perpendicular to the optical axis at the focus position A so that the detection waveform becomes symmetrical, the coma aberration, in fact, remains as shown in FIG. 11. FIG. 11 is a graph showing the relationship between the waveform asymmetry E after coma aberration is adjusted until the waveform asymmetry E3 becomes zero, and the focus position Z of the wafer alignment mark 42 relative to the wafer alignment detection system 80.

Referring to FIG. 11, the waveform asymmetry E3 is zero at the focus position A. In practice, however, a coma aberration C as the difference between the waveform asymmetries E3 and E1 remains in the wafer alignment detection system 80. The reason why the waveform asymmetry E3 is zero at the focus position A is that the waveform asymmetries due to an optical axis shift and coma aberration cancel each other (i.e., act on each other in opposite directions).

Consider a case in which coma aberration of the optical system of the wafer alignment detection system 80 is adjusted at a focus position B shown in FIG. 9. At the focus position B, even when the wafer alignment detection system 80 has an optical axis shift in addition to coma aberration (E2 and E3), the same waveform asymmetry as that in the case in which the wafer alignment detection system 80 has coma aberration alone (E1) is obtained. The waveform asymmetry is free from the influence of an optical axis shift of the wafer alignment detection system 80 at the focus position B. In other words, the focus position B is insensitive to an optical axis shift. When coma aberration of the wafer alignment detection system 80 is adjusted by driving the optical member 810 in a direction perpendicular to the optical axis at the focus position B so that the detection waveform becomes symmetrical, only the coma aberration can be adjusted with high accuracy without the influence of an optical axis shift.

FIG. 12 shows the relationship between the waveform asymmetry E after coma aberration of the wafer alignment detection system 80 is adjusted at a focus position, at which the waveform asymmetry is free from the influence of an optical axis shift (telecentricity), such as the focus position B, and the focus position of the wafer alignment mark 42. A focus position at which the waveform asymmetry is free from the influence of an optical axis shift of the wafer alignment detection system 80 will be referred to as a coma aberration adjustment focus position hereinafter.

In FIG. 12, reference symbol E2a corresponds to the waveform asymmetry E2 shown in FIG. 9 when coma aberration of the wafer alignment detection system 80 is adjusted perfectly and only an optical axis shift remains in the wafer alignment detection system 80. Likewise, reference symbol E3a corresponds to the waveform asymmetry E3 shown in FIG. 9 when coma aberration of the wafer alignment detection system 80 is adjusted perfectly and only an optical axis shift remains in the wafer alignment detection system 80.

Each of the waveform asymmetries E2a and E3a shown in FIG. 12 is attributed to an optical axis shift of the optical system of the wafer alignment detection system 80 because no coma aberration remains in the wafer alignment detection system 80. An optical axis shift of the wafer alignment detection system 80 is preferably adjusted at a focus position D at which the waveform asymmetry is relatively high. The focus position D can be detected by, for example, driving (defocusing) the wafer alignment mark 42. As described above, an optical axis shift of the wafer alignment detection system 80 can be adjusted by driving the illumination light source 801 or aperture stop 803 in a direction perpendicular to the optical axis via the driving unit 813 or 814.

An optical axis shift of the wafer alignment detection system 80 may be adjusted using the position shift amount of the wafer alignment mark 42 with respect to the driving (defocus) as a reference. When the position shift amount is used as a reference, an optical axis shift is adjusted so that the detection waveform of the wafer alignment mark 42 at each focus position upon defocusing the wafer alignment mark 42 stays constant independently of the focus position. The position of the wafer alignment mark 42 shifts due to both coma aberration and an optical axis shift of the wafer alignment detection system 80. In this case, however, coma aberration of the wafer alignment detection system 80 is adjusted perfectly, so the position of the wafer alignment mark 42 shifts due to an optical axis shift of the wafer alignment detection system 80 alone.

FIG. 13 is a graph showing the relationship between the waveform asymmetry E after an optical axis shift of the wafer alignment detection system 80 is adjusted at the focus position D and the focus position of the wafer alignment mark 42. Referring to FIG. 13, since coma aberration and an optical axis shift of the wafer alignment detection system 80 as the causes of the waveform asymmetries are adjusted perfectly, no waveform asymmetry occurs with respect to the focus position of the wafer alignment mark 42.

In this manner, coma aberration and an optical axis shift of the wafer alignment detection system 80 can be adjusted separately (independently) by adjusting the coma aberration of the wafer alignment detection system 80 at the coma aberration adjustment focus position.

Figure 14:
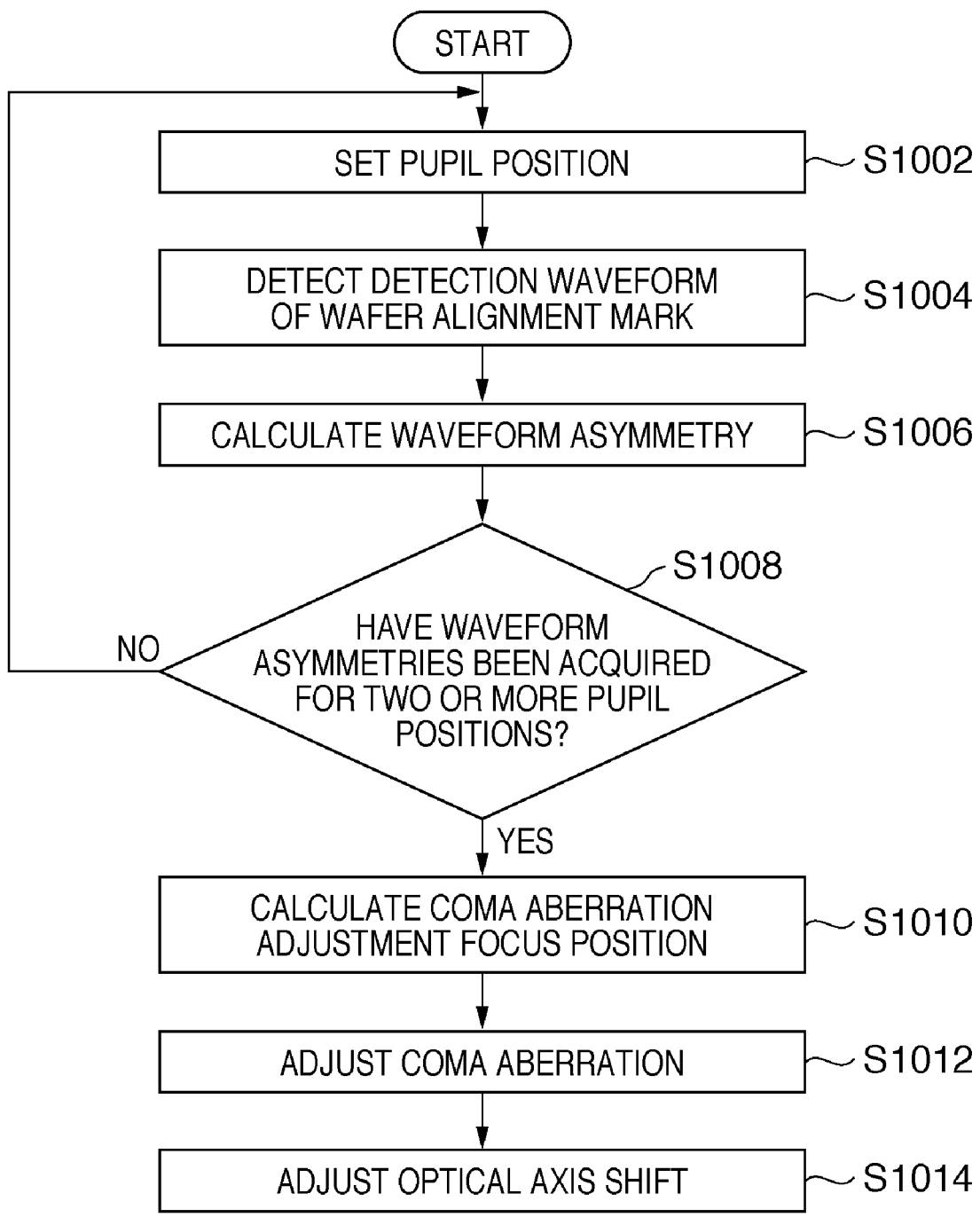
FIG. 14 is a flowchart for explaining an adjustment method for the wafer alignment detection system according to one aspect of the present invention.

A detailed adjustment method (particularly, coma aberration adjustment focus position specification) for the wafer alignment detection system 80 will be explained with reference to FIG. 14. FIG. 14 is a flowchart for explaining an adjustment method for the wafer alignment detection system 80 according to one aspect of the present invention.

To specify the coma aberration adjustment focus position of the wafer alignment detection system 80, it is necessary to acquire the waveform asymmetry E with respect to the focus position of the wafer alignment mark 42 for each of two different pupil positions (positions of the aperture stop 803). In step S1002, one pupil position is set for the optical system of the wafer alignment detection system 80 (setting step). In other words, an optical axis shift is generated in the wafer alignment detection system 80 by driving the position of the aperture stop 803 in a direction perpendicular to the optical axis. In step S1004, the detection waveform of the wafer alignment mark 42 is detected while relatively changing the focus position of the wafer alignment mark 42 (detecting step). More specifically, by repeating the driving (defocusing) of the wafer alignment mark 42 and the detection of the wafer alignment mark 42 at the focus position, a detection waveform as shown in FIG. 6B can be obtained at each of a plurality of focus positions.

In step S1006, a waveform asymmetry (evaluation value) representing the asymmetry of the detection waveform detected in step S1004 is calculated (calculating step). More specifically, the waveform asymmetry is calculated in accordance with the definition of the waveform asymmetry described with reference to FIG. 10. This makes it possible to acquire the waveform asymmetry with respect to the focus position of the wafer alignment mark 42 for one pupil position.

In step S1008, it is determined whether the waveform asymmetry with respect to the focus position of the wafer alignment mark 42 has been acquired for each of two or more pupil positions. If the waveform asymmetry with respect to the focus position of the wafer alignment mark 42 has not been acquired for each of two or more pupil positions yet, the process returns to step S1002 to acquire the waveform asymmetry for another pupil position.

If the waveform asymmetry with respect to the focus position of the wafer alignment mark 42 has already been acquired for each of two or more pupil positions, in step S1010 the coma aberration adjustment focus position is calculated (specified) based on the acquired waveform asymmetry (specifying step). More specifically, a focus position at which the waveform asymmetry calculated in step S1006 stays constant between two or more pupil positions, that is, the intersection (the focus position B as shown in FIG. 9) of the waveform asymmetry characteristic lines is specified as the coma aberration adjustment focus position.

In step S1012, coma aberration of the wafer alignment detection system 80 is adjusted at the coma aberration adjustment focus position specified in step S1010 (first adjusting step). More specifically, coma aberration of the wafer alignment detection system 80 is adjusted by moving the wafer alignment mark 42 to the coma aberration adjustment focus position, and driving the optical member 810 in a direction perpendicular to the optical axis so that the waveform asymmetry calculated in step S1006 becomes zero.

In step S1014, an optical axis shift of the wafer alignment detection system 80 is adjusted (second adjusting step). More specifically, the wafer alignment mark 42 is moved from the coma aberration adjustment focus position to a focus position (e.g., the focus position D shown in FIG. 12) at which the waveform asymmetry is relatively high. At this focus position, an optical axis shift of the wafer alignment detection system 80 is adjusted by driving the illumination light source 801 or aperture stop 803 in a direction perpendicular to the optical axis so that the waveform asymmetry becomes zero. As described above, an optical axis shift of the wafer alignment detection system 80 may be adjusted using the position shift amount of the wafer alignment mark 42 with respect to the defocus as a reference.

In this manner, the adjustment method for the wafer alignment detection system 80 according to this embodiment can perfectly adjust coma aberration and an optical axis shift of the wafer alignment detection system 80 (i.e., adjust the wafer alignment detection system 80 to a state in which it has neither coma aberration nor optical axis shift).

Although the waveform asymmetry with respect to the focus position of the wafer alignment mark 42 is acquired for each of two pupil positions in this embodiment, the waveform asymmetry with respect to the focus position of the wafer alignment mark 42 may be acquired for each of two or more pupil positions. A process (i.e., steps S1002 to S1006) of acquiring the waveform asymmetry for each of two or more pupil positions need not be performed every time the coma aberration adjustment focus position is specified. For example, consider a case in which the waveform asymmetry with respect to the focus position of the wafer alignment mark 42 as shown in FIG. 9 is acquired. In this case, wafer alignment marks which are formed on the same wafer and set under the same illumination condition can be easily moved to a specific coma aberration adjustment focus position by acquiring the difference between a best focus position and the coma aberration adjustment focus position. The best focus position means a position at which the contrast of the detection waveform is a maximum.

Figure 15:
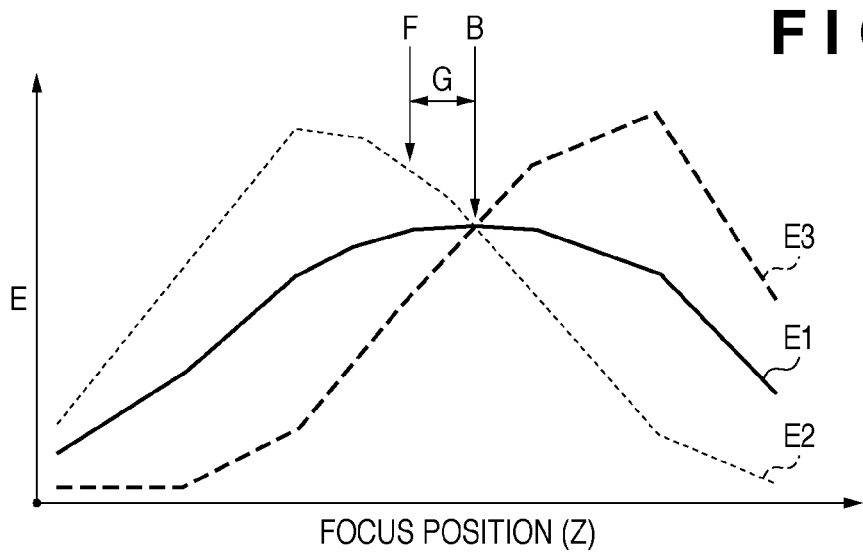
FIG. 15 is a graph showing the relationship between the waveform asymmetry when the wafer alignment mark is illuminated under a certain illumination condition and the focus position of the wafer alignment mark.

FIG. 15 is a graph showing the relationship between the waveform asymmetry E and the focus position Z of the wafer alignment mark 42 when the wafer alignment mark 42 is illuminated under a certain illumination condition. In FIG. 15, a focus position F is a best focus position. To move the wafer alignment mark 42 to the focus position B as the coma aberration adjustment focus position, the focus position (best focus position) F is calculated and a difference G between the focus positions F and B is acquired first. After being moved to the focus position F, the wafer alignment mark 42 is moved by the difference G. With this operation, the wafer alignment mark 42 can be moved to the focus position B as the coma aberration adjustment focus position. By acquiring the relationship between the best focus position and the coma aberration adjustment focus position, the wafer alignment mark 42 can be easily moved to the coma aberration adjustment focus position in a short period of time in the adjustment of the wafer alignment detection system 80 for the second and subsequent times. The method of adjusting coma aberration by moving the wafer alignment mark 42 from the best focus position to the coma aberration adjustment focus position can be used either when assembling the wafer alignment detection system 80 or after mounting it in the exposure apparatus.

Although a method of adjusting the wafer alignment detection system 80 using a wafer alignment mark 42 having a step DL of $\lambda/4$ has been described in this embodiment, this method is not particularly limited to the use of a wafer alignment mark 42 having a step DL of $\lambda/4$. As long as there is a coma aberration adjustment focus position at which the waveform asymmetry is free from the influence of an optical axis shift, any wafers such as a resist wafer and process wafer may be used. However, a wafer which exhibits a relatively high sensitivity to coma aberration is preferably used to adjust the coma aberration with high accuracy.

Figure 16:
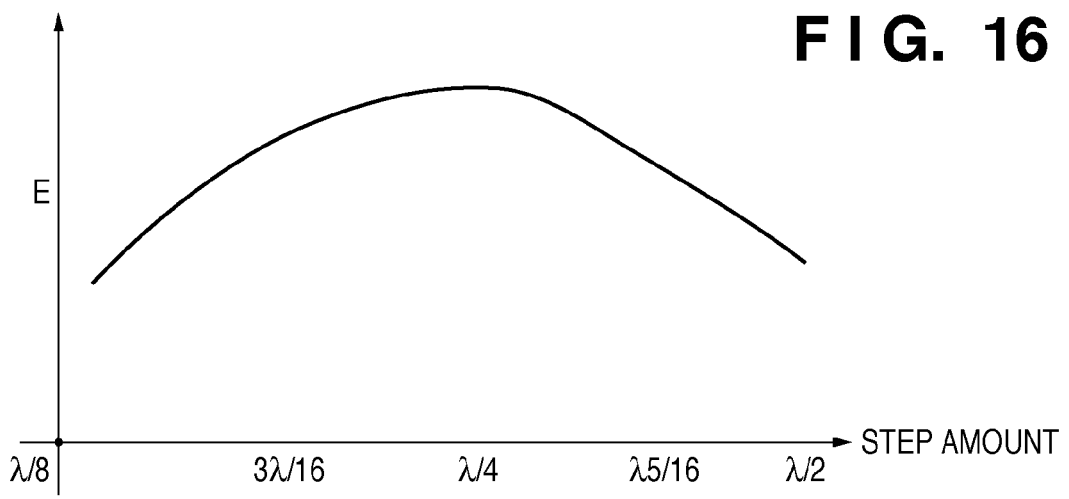
FIG. 16 is a graph showing the relationship between the waveform asymmetry of the detection waveform between its inner upper peaks at the coma aberration adjustment focus position and the step amount of the wafer alignment mark.

FIG. 16 is a graph showing the relationship between the waveform asymmetry E of the detection waveform between its inner upper peaks (the inner upper peaks $WU_1$, of the detection waveform shown in FIG. 6B) at the coma aberration adjustment focus position and the step amount of the wafer alignment mark 42. In FIG. 16, the ordinate indicates the waveform asymmetry E, and the abscissa indicates the step amount of the wafer alignment mark 42. Referring to FIG. 16, the waveform asymmetry E is highest when the step amount of the wafer alignment mark 42 is around $\lambda/4$.

Figure 17:
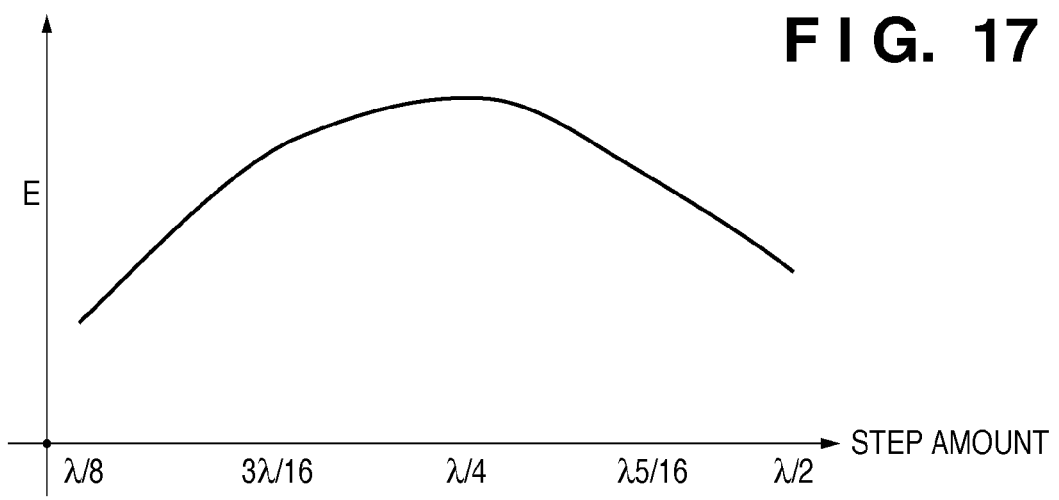
FIG. 17 is a graph showing the relationship between the waveform asymmetry of the detection waveform between its outer upper peaks at the coma aberration adjustment focus position and the step amount of the wafer alignment mark.

FIG. 17 is a graph showing the relationship between the waveform asymmetry E of the detection waveform between its outer upper peaks (the outer upper peaks $WU_2$ of the detection waveform shown in FIG. 6B) and the step amount of the wafer alignment mark 42. In FIG. 17, the ordinate indicates the waveform asymmetry E, and the abscissa indicates the step amount of the wafer alignment mark 42. Referring to FIG. 17, the waveform asymmetry E is highest when the step amount of the wafer alignment mark 42 is around $\lambda/4$.

In this manner, in adjusting coma aberration of the wafer alignment detection system 80, a wafer alignment mark 42 having a step DL of about $\lambda/4$ exhibits a highest sensitivity with respect to the coma aberration irrespective of whether the inner upper peaks or outer upper peaks of the detection waveform is obtained. Hence, the use of a wafer alignment mark 42 having a step DL of about $\lambda/4$ allows adjusting coma aberration of the wafer alignment detection system 80 with high accuracy. Since the relationships of the waveform asymmetry E to the step amount of the wafer alignment mark 42 shown in FIGS. 16 and 17 periodically change, coma aberration can be adjusted with high accuracy using even a wafer alignment mark 42 having a step DL of an odd multiple of $\lambda/4$.

A method of adjusting the wafer alignment detection system 80 using a detection waveform when the wafer alignment mark 42 is illuminated (detected) with an illuminance σ value of 0.4 has been described in this embodiment. However, the wafer alignment mark 42 may be illuminated (detected) with any illumination σ value as long as a detection waveform having upper peaks $WU_1$ and $WU_2$ as shown in FIG. 6B can be obtained.

Figure 18C:
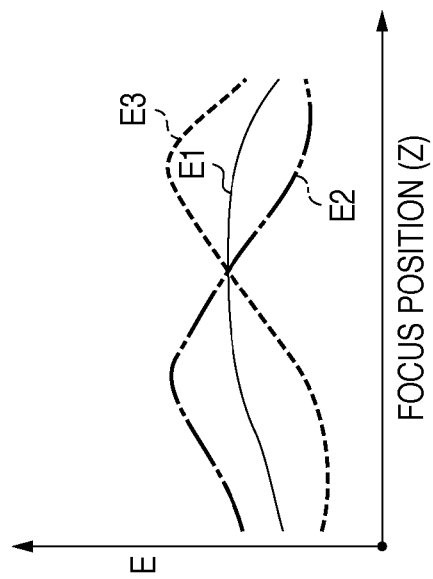
FIGS. 18A to 18C are graphs showing the relationships between the waveform asymmetries between the inner upper peaks of detection waveforms obtained by illuminating (detecting) a wafer alignment mark having a step of $\lambda/4$ with three illumination $\sigma$ values and the focus position of the wafer alignment mark.
Figure 18B:
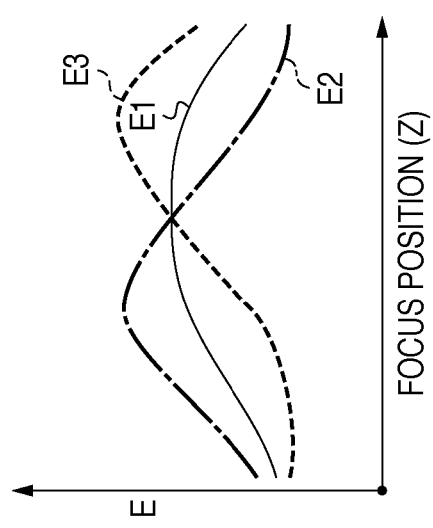
Figure 18A:
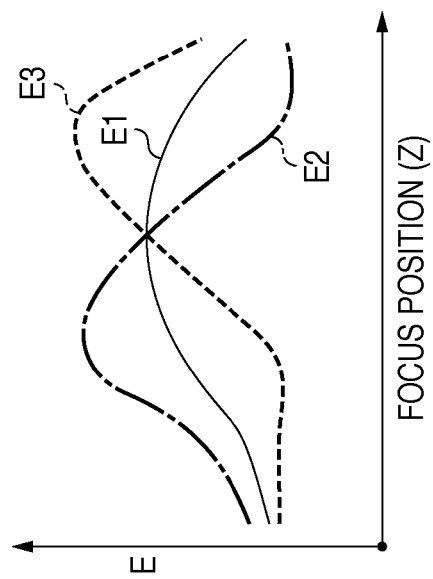

FIGS. 18A to 18C are graphs showing the relationships between the waveform asymmetries between the inner upper peaks of detection waveforms obtained by illuminating (detecting) a wafer alignment mark 42 having a step DL of $\lambda/4$ with three illumination σ values and the focus position Z of the wafer alignment mark 42. FIG. 18A shows a case in which the illumination σ value is 0.3, FIG. 18B shows a case in which the illumination σ value is 0.4, and FIG. 18C shows a case in which the illumination σ value is 0.6.

In FIGS. 18A to 18C, reference symbol E1 indicates the waveform asymmetry when the wafer alignment detection system 80 has no optical axis shift but has coma aberration alone. Reference symbol E2 indicates the waveform asymmetry when the wafer alignment detection system 80 has an optical axis shift and coma aberration in an amount equal to that in E1. Reference symbol E3 indicates the waveform asymmetry when the wafer alignment detection system 80 has an optical axis shift which has the same absolute amount as that in E2 but whose direction is opposite to that in E2, and has coma aberration in an amount equal to that in E1.

The scales along the ordinates in FIGS. 18A to 18C are the same. Even when the waveform asymmetry E changes between different illumination σ values, there are coma aberration adjustment focus positions for the respective illumination σ values.

Figure 19C:
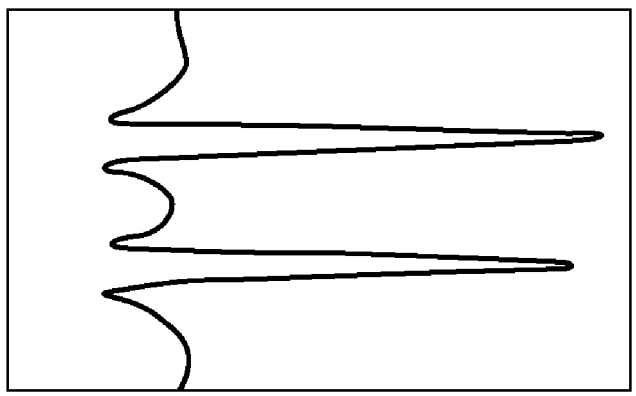
FIGS. 19A to 19C are charts showing detection waveforms when the wafer alignment detection system has illuminated (detected) the wafer alignment mark with respective illumination $\sigma$ values (0.3, 0.4, and 0.6) while there is neither coma aberration nor optical axis shift (ideal state).
Figure 19B:
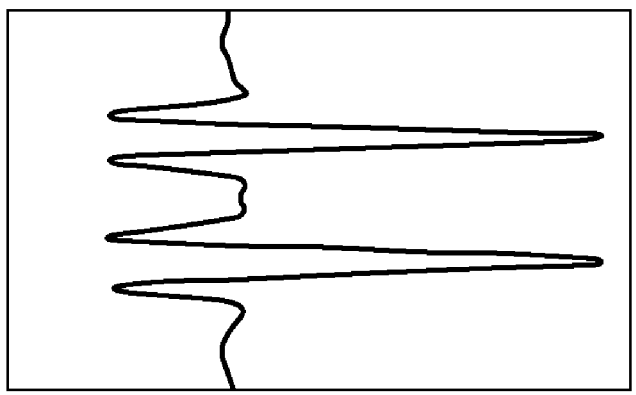
Figure 19A:

FIGS. 19A to 19C show detection waveforms when the wafer alignment detection system 80 has illuminated (detected) the wafer alignment mark 42 with respective illumination σ values (0.3, 0.4, and 0.6) while there is neither coma aberration nor optical axis shift (ideal state). FIG. 19A shows a case in which the illumination σ value is 0.3, FIG. 19B shows a case in which the illumination σ value is 0.4, and FIG. 19C shows a case in which the illumination σ value is 0.6.

Referring to FIGS. 18A to 18C and 19A to 19C, there is a coma aberration adjustment focus position for any illumination σ value as long as a detection waveform having upper peaks $WU_1$ and $WU_2$ as shown in FIG. 6B is obtained, and then coma aberration can be adjusted at the coma aberration adjustment focus position with high accuracy.

Figure 20:
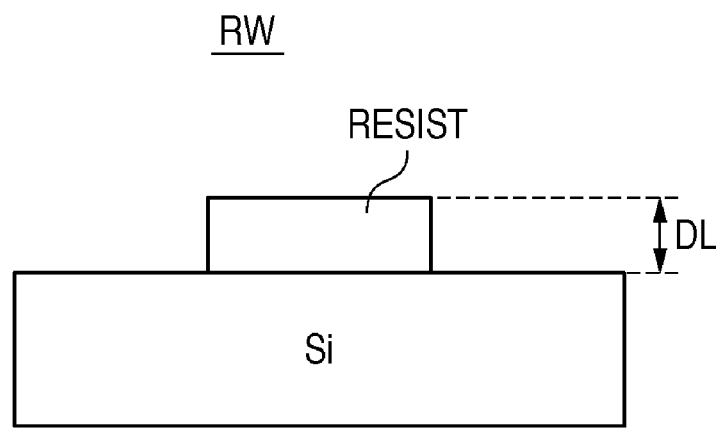
FIG. 20 is a schematic sectional view showing a resist wafer in which a step is formed on its silicon surface by a resist.
Figure 21:
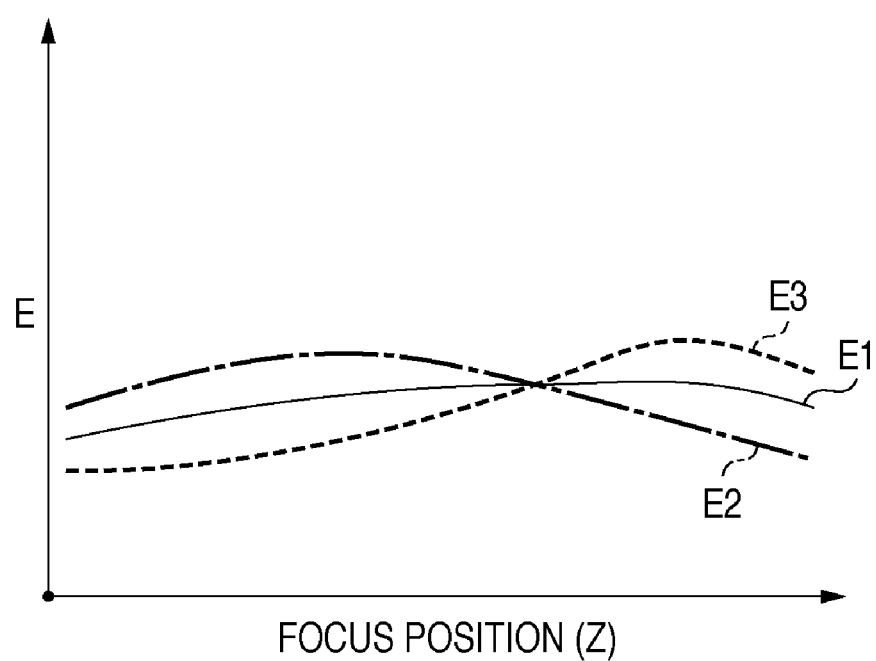
FIG. 21 is a graph showing the relationship between the waveform asymmetry between the inner upper peaks of a detection waveform obtained by the resist wafer shown in FIG. 20 and the focus position of the resist wafer.

Consider a case in which a resist wafer RW in which a step DL is formed on its silicon surface by a resist, as shown in FIG. 20. FIG. 21 shows the relationship between the waveform asymmetry between the inner upper peaks of a detection waveform obtained when the wafer alignment detection system 80 illuminates (detects) the resist wafer RW with an illumination σ value of 0.4 and the focus position Z of the resist wafer RW. FIG. 22 shows a detection waveform when the wafer alignment detection system 80 has illuminated (detected) the resist wafer RW with an illumination σ value of 0.4 while there is neither coma aberration nor optical axis shift (ideal state).

In FIG. 21, reference symbol E1 indicates the waveform asymmetry when the wafer alignment detection system 80 has no optical axis shift but has coma aberration alone. Reference symbol E2 indicates the waveform asymmetry when the wafer alignment detection system 80 has an optical axis shift and coma aberration in an amount equal to that in E1. Reference symbol E3 indicates the waveform asymmetry when the wafer alignment detection system 80 has an optical axis shift which has the same absolute amount as that in E2 but whose direction is opposite to that in E2, and has coma aberration in an amount equal to that in E1.

Referring to FIG. 21, there is a coma aberration adjustment focus position. The adjustment method for the wafer alignment detection system 80 according to this embodiment may use a process wafer or the resist wafer RW as shown in FIG. 20 as long as a detection waveform having upper peaks $WU_1$ and $WU_2$ as shown in FIG. 6B can be obtained.

Although a method of adjusting the wafer alignment detection system 80 using the waveform asymmetry between the upper peaks $WU_1$ and $WU_2$ of the detection waveform shown in FIG. 6B has been described in this embodiment, the waveform asymmetry between lower peaks $WD_1$ of the detection waveform shown in FIG. 6B may be used.

FIG. 23 is a graph showing the relationship between the waveform asymmetry E of the detection waveform between its lower peaks (the lower peaks $WD_1$ of the detection waveform shown in FIG. 6B) and the focus position Z of the wafer alignment mark 42 relative to the wafer alignment detection system 80. FIG. 23 illustrates a case in which the wafer alignment detection system 80 illuminated (detected) the wafer alignment mark 42 (see FIG. 5) having a step DL of λ/8 with an illumination σ value of 0.4.

In FIG. 23, reference symbol E11 indicates the waveform asymmetry when the wafer alignment detection system 80 has no optical axis shift but has coma aberration alone. Reference symbol E21 indicates the waveform asymmetry when the wafer alignment detection system 80 has an optical axis shift and coma aberration in an amount equal to that in E11. Reference symbol E31 indicates the waveform asymmetry when the wafer alignment detection system 80 has an optical axis shift which has the same absolute amount as that in E21 but whose direction is opposite to that in E21, and has coma aberration in an amount equal to that in E11.

Referring to FIG. 23, there is a focus position (coma aberration adjustment focus position) B at which the waveform asymmetry E is free from the influence of an optical axis shift of the wafer alignment detection system 80. Hence, the coma aberration adjustment focus position can be specified using even the waveform asymmetry between the lower peaks of the detection waveform as shown in FIG. 23.

The adjustment method (i.e., coma aberration adjustment at the coma aberration adjustment focus position) for the wafer alignment detection system 80 according to this embodiment can be used either when assembling the wafer alignment detection system 80 or after mounting it in the exposure apparatus. If coma aberration is adjusted after mounting the wafer alignment detection system 80 in the exposure apparatus, the control unit 90 automatically drives the optical member 810 via the driving unit 815 based on the waveform asymmetry. If an optical axis shift is adjusted after mounting the wafer alignment detection system 80 in the exposure apparatus, the control unit 90 automatically drives the illumination light source 801 or aperture stop 803 via the driving unit 813 or 814 based on the waveform asymmetry. When the wafer alignment detection system 80 is mounted in the exposure apparatus, the wafer alignment detection system 80 is preferably adjusted in periodical maintenance of the exposure apparatus or as a fault occurs in the exposure apparatus.

A method of adjusting an optical axis shift after coma aberration is adjusted at a focus position (coma aberration adjustment focus position) at which the waveform asymmetry is free from the influence of the optical axis shift of the wafer alignment detection system 80 has been described previously. However, coma aberration can be adjusted even after an optical axis shift is adjusted at a focus position at which the waveform asymmetry is free from the influence of coma aberration of the wafer alignment detection system 80.

Figure 24B:
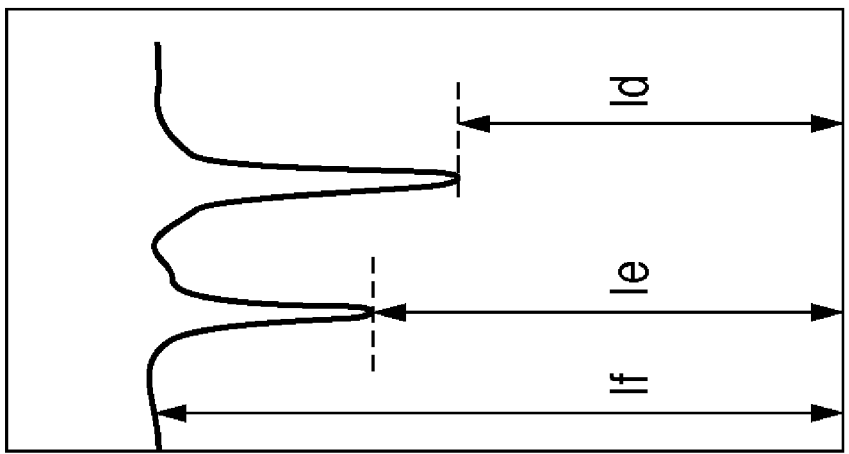
FIGS. 24A and 24B are charts showing an example of detection waveforms obtained when a wafer alignment mark having a step of λ/8 has been illuminated with an illumination σ value of 0.9.
Figure 24A:
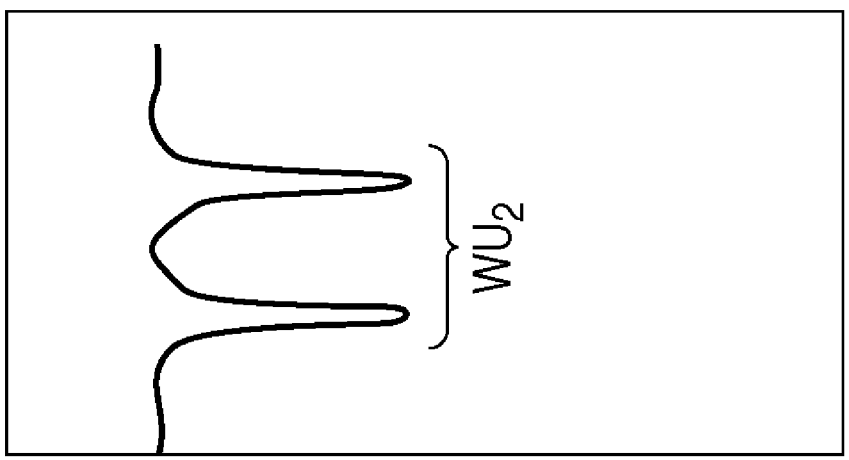

A method of adjusting an optical axis shift at a focus position at which the detection waveform asymmetry is free from the influence of coma aberration of the optical system of the wafer alignment detection system 80 will be explained. FIGS. 24A and 24B are charts showing an example of detection waveforms obtained when the wafer alignment mark 42 (see FIG. 5) having a step DL of λ/8 has been illuminated (detected) with an illumination σ value of 0.9. FIG. 24A shows a detection waveform obtained when the wafer alignment detection system 80 has neither coma aberration nor optical axis shift. FIG. 24B shows a detection waveform obtained when the wafer alignment detection system 80 has coma aberration or an optical axis shift.

Figure 25:
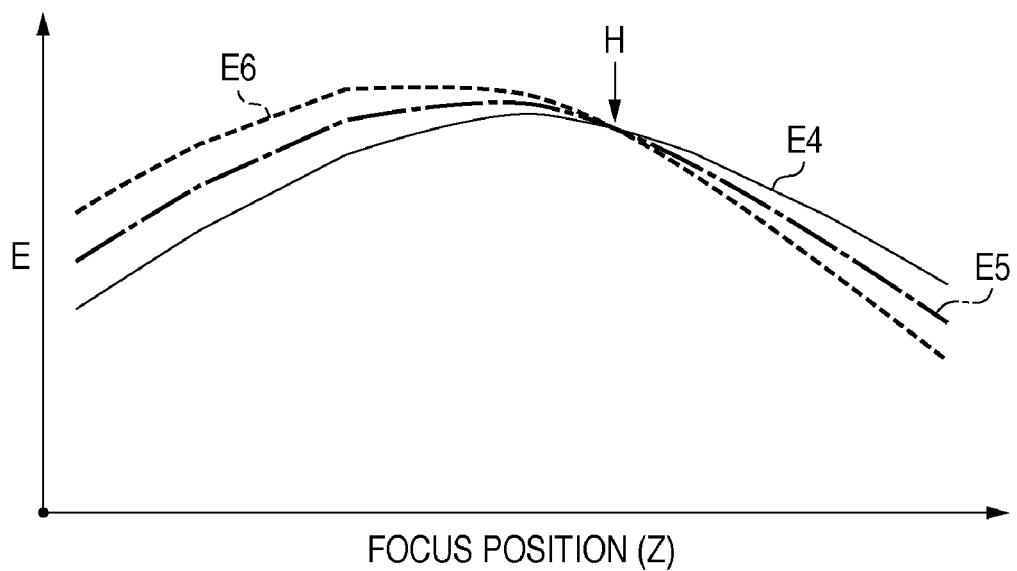
FIG. 25 is a graph showing the relationships between the waveform asymmetries of the detection waveforms shown in FIGS. 24A and 24B and the focus position of the wafer alignment mark relative to the wafer alignment detection system.

FIG. 25 is a graph showing the relationships between the waveform asymmetries E of the detection waveforms shown in FIGS. 24A and 24B and the focus position Z of the wafer alignment mark 42 relative to the wafer alignment detection system 80. In FIG. 25, the ordinate indicates the waveform asymmetry E, and the abscissa indicates the focus position Z. The waveform asymmetry E is defined by $(Ie-Id)/If$ [%] where Ie is the intensity of the lower peak on the left side, Id is the intensity of the lower peak on the right side, and If is the intensity of the base line in, for example, the detection waveform shown in FIG. 24B.

In FIG. 25, reference symbol E4 indicates the waveform asymmetry when the wafer alignment detection system 80 has no coma aberration but has an optical axis shift alone. Reference symbol E5 indicates the waveform asymmetry when the wafer alignment detection system 80 has coma aberration and an optical axis shift in an amount equal to that in E4. Reference symbol E6 indicates the waveform asymmetry when the wafer alignment detection system 80 has coma aberration in an amount twice that in E5 and an optical axis shift in an amount equal to that in E4.

Referring to FIG. 25, at a focus position H, even when the wafer alignment detection system 80 has coma aberration in addition to an optical axis shift (E5 and E6), the same waveform asymmetry as that in the case in which the wafer alignment detection system 80 has an optical axis shift alone (E4) is obtained. The waveform asymmetry is free from the influence of coma aberration of the wafer alignment detection system 80 at the focus position H. In other words, the focus position H is insensitive to coma aberration. By driving the illumination light source 801 or aperture stop 803 in a direction perpendicular to the optical axis at the focus position H so that the detection waveform becomes symmetrical, only an optical axis shift can be adjusted with high accuracy without the influence of coma aberration of the wafer alignment detection system 80.

Figure 26:
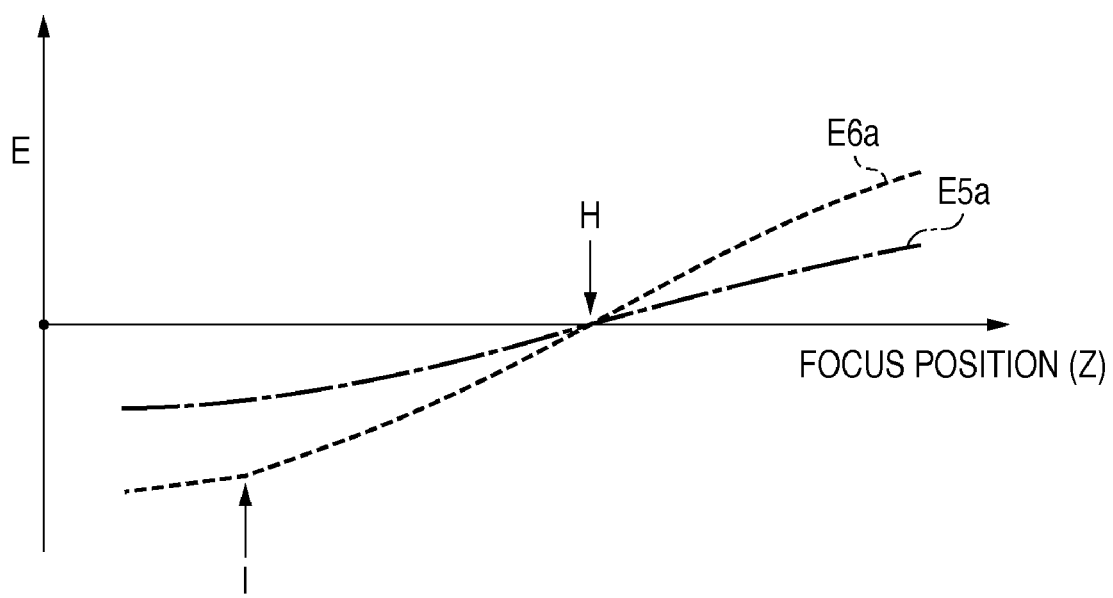
FIG. 26 is a graph showing the relationship between the waveform asymmetry after an optical axis shift of the wafer alignment detection system is adjusted at an optical axis shift adjustment focus position and the focus position of the wafer alignment mark.

FIG. 26 shows the relationship between the waveform asymmetry E after an optical axis shift of the wafer alignment detection system 80 is adjusted at a focus position, at which the waveform asymmetry is free from the influence of coma aberration, such as the focus position H, and the focus position of the wafer alignment mark 42. A focus position at which the waveform asymmetry is free from the influence of coma aberration of the wafer alignment detection system 80 will be referred to as an optical axis shift adjustment focus position hereinafter.

In FIG. 26, reference symbol E5a corresponds to the waveform asymmetry E5 shown in FIG. 25 when an optical axis shift of the wafer alignment detection system 80 is adjusted perfectly and only coma aberration remains in the wafer alignment detection system 80. Likewise, reference symbol E6a corresponds to the waveform asymmetry E6 shown in FIG. 25 when an optical axis shift of the wafer alignment detection system 80 is adjusted perfectly and only coma aberration (in an amount twice that in E5a) remains in the wafer alignment detection system 80.

Each of the waveform asymmetries E5a and E6a shown in FIG. 26 is attributed to coma aberration of the optical system of the wafer alignment detection system 80 because no optical axis shift remains in the wafer alignment detection system 80. Coma aberration of the wafer alignment detection system 80 is preferably adjusted at a focus position I at which the waveform asymmetry is relatively high. The focus position I can be detected by, for example, driving (defocusing) the wafer alignment mark 42. As described above, coma aberration of the wafer alignment detection system 80 can be adjusted by driving the optical member 810 in a direction perpendicular to the optical axis via the driving unit 815.

Coma aberration of the wafer alignment detection system 80 may be adjusted using the position shift amount of the wafer alignment mark 42 with respect to the driving (defocus) as a reference. When the position shift amount is used as a reference, coma aberration is adjusted so that the detection waveform of the wafer alignment mark 42 at each focus position upon defocusing the wafer alignment mark 42 stays constant independently of the focus position. The position of the wafer alignment mark 42 shifts due to both coma aberration and an optical axis shift of the wafer alignment detection system 80. In this case, however, an optical axis shift of the wafer alignment detection system 80 is adjusted perfectly, so the position of the wafer alignment mark 42 shifts due to coma aberration of the wafer alignment detection system 80 alone.

The relationship between the waveform asymmetry E after coma aberration of the wafer alignment detection system 80 is adjusted at the focus position I and the focus position of the wafer alignment mark 42 is similar to that shown in FIG. 13. Since coma aberration and an optical axis shift of the wafer alignment detection system 80 as the causes of the waveform asymmetries are adjusted perfectly, no waveform asymmetry occurs with respect to the focus position of the wafer alignment mark 42.

In this manner, coma aberration and an optical axis shift of the wafer alignment detection system 80 can be adjusted separately (independently) by adjusting the optical axis shift of the wafer alignment detection system 80 at the optical axis shift adjustment focus position.

Figure 27:
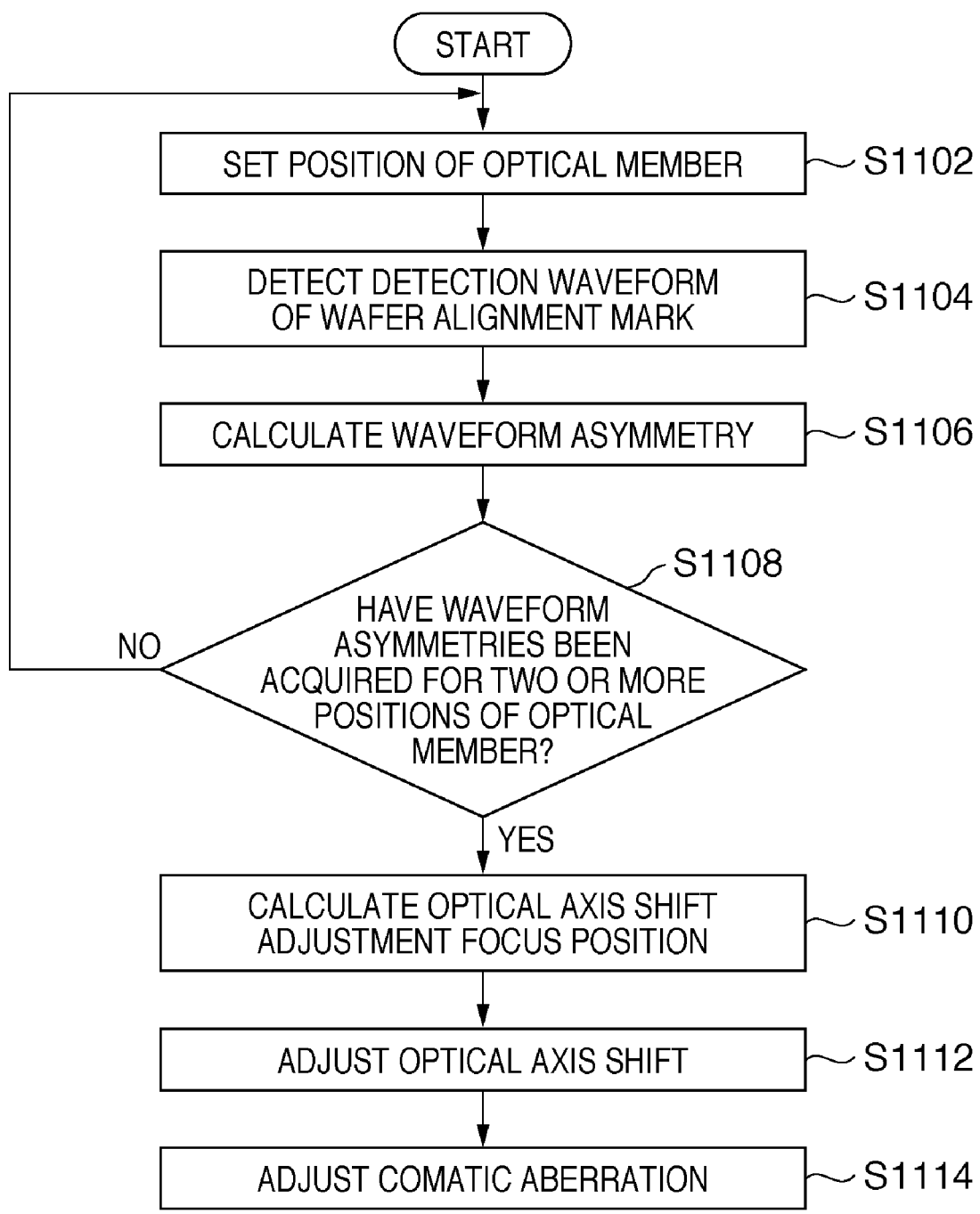
FIG. 27 is a flowchart for explaining an adjustment method for the wafer alignment detection system according to one aspect of the present invention.

A detailed adjustment method (especially, optical axis shift adjustment focus position specification) for the wafer alignment detection system 80 will be explained with reference to FIG. 27. FIG. 27 is a flowchart for explaining an adjustment method for the wafer alignment detection system 80 according to one aspect of the present invention.

To specify the optical axis shift adjustment focus position of the wafer alignment detection system 80, it is necessary to acquire the waveform asymmetry E with respect to the focus position of the wafer alignment mark 42 for each of two different positions of the optical member 810. In step S1102, the position of the optical member 810 in the wafer alignment detection system 80 is set (setting step). In other words, coma aberration is generated in the wafer alignment detection system 80 by driving the optical member 810 in a direction perpendicular to the optical axis. In step S1104, the detection waveform of the wafer alignment mark 42 is detected while relatively changing the focus position of the wafer alignment mark 42 (detecting step). More specifically, by repeating the driving (defocusing) of the wafer alignment mark 42 and the detection of the wafer alignment mark 42 at the focus position, detection waveforms as shown in FIGS. 24A and 24B can be obtained for a plurality of focus positions.

In step S1106, a waveform asymmetry (evaluation value) representing the asymmetry of the detection waveform detected in step S1104 is calculated (calculating step). More specifically, the waveform asymmetry is calculated in accordance with the definition of the waveform asymmetry described with reference to FIGS. 24A and 24B. This makes it possible to acquire the waveform asymmetry with respect to the focus position of the wafer alignment mark 42 for one position of the optical member 810.

In step S1108, it is determined whether the waveform asymmetry with respect to the focus position of the wafer alignment mark 42 has been acquired for each of two or more positions of the optical member 810. If the waveform asymmetry with respect to the focus position of the wafer alignment mark 42 has not been acquired for each of two or more positions of the optical member 810 yet, the process returns to step S1102 to acquire the waveform asymmetry for another position of the optical member 810.

If the waveform asymmetry with respect to the focus position of the wafer alignment mark 42 has already been acquired for each of two or more positions of the optical member 810, the process advances to step S1110. In step S1110, the optical axis shift adjustment focus position is calculated (specified) based on the waveform asymmetry calculated in step S1106 (specifying step). More specifically, a focus position at which the waveform asymmetry calculated in step S1106 stays constant between two or more positions of the optical member 810, that is, the intersection (the focus position H as shown in FIG. 25) of the waveform asymmetry characteristic lines is specified as the optical axis shift adjustment focus position.

In step S1112, an optical axis shift of the wafer alignment detection system 80 is adjusted at the optical axis shift adjustment focus position specified in step S1110 (first adjusting step). More specifically, an optical axis shift of the wafer alignment detection system 80 is adjusted by moving the wafer alignment mark 42 to the optical axis shift adjustment focus position, and driving the illumination light source 801 or aperture stop 803 in a direction perpendicular to the optical axis so that the waveform asymmetry calculated in step S1106 becomes zero.

In step S1114, coma aberration of the wafer alignment detection system 80 is adjusted (second adjusting step). More specifically, the wafer alignment mark 42 is moved from the optical axis shift adjustment focus position to a focus position (e.g., the focus position I shown in FIG. 26) at which the waveform asymmetry is relatively high. At this focus position, coma aberration of the wafer alignment detection system 80 is adjusted by driving the optical member 810 in a direction perpendicular to the optical axis so that the waveform asymmetry becomes zero. As described above, coma aberration of the wafer alignment detection system 80 may be adjusted using the position shift amount of the wafer alignment mark 42 with respect to the defocus as a reference.

In this manner, the adjustment method for the wafer alignment detection system 80 according to this embodiment can perfectly adjust coma aberration and an optical axis shift of the wafer alignment detection system 80 (i.e., adjust the wafer alignment detection system 80 to a state in which it has neither coma aberration nor optical axis shift).

Although the waveform asymmetry with respect to the focus position of the wafer alignment mark 42 is acquired for each of two positions of the optical member 810 in this embodiment, the waveform asymmetry with respect to the focus position of the wafer alignment mark 42 may be acquired for each of three or more positions of the optical member 810. A process (i.e., steps S1102 to S1106) of acquiring the waveform asymmetry for each of two or more positions of the optical member 810 need not be performed every time the optical axis shift adjustment focus position is specified. For example, consider a case in which the waveform asymmetry with respect to the focus position of the wafer alignment mark 42 as shown in FIG. 25 is acquired. In this case, wafer alignment marks 42 which are formed on the same wafer and set under the same illumination condition can be easily moved to a specific optical axis shift adjustment focus position by acquiring the difference between a best focus position and the optical axis shift adjustment focus position.

Figure 28:
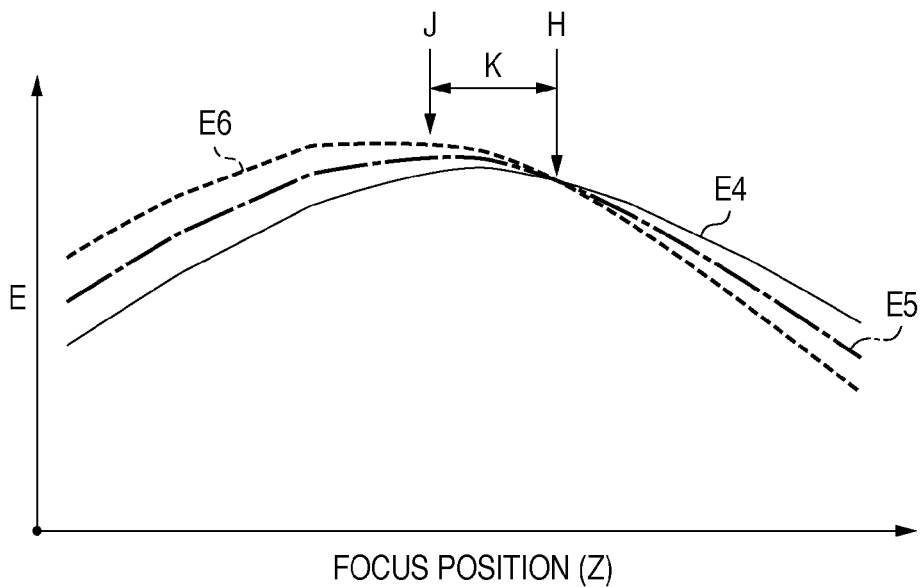
FIG. 28 is a graph showing the relationship between a waveform asymmetry and the focus position of the wafer alignment mark when the wafer alignment mark is illuminated under a certain illumination condition.

FIG. 28 is a graph showing the relationship between the waveform asymmetry E and the focus position Z of the wafer alignment mark 42 when the wafer alignment mark 42 is illuminated under a certain illumination condition. In FIG. 28, a focus position J is a best focus position. To move the wafer alignment mark 42 to the focus position H as the optical axis shift adjustment focus position, the focus position (best focus position) J is calculated and a difference K between the focus positions J and H is acquired first. After being moved to the focus position J, the wafer alignment mark 42 is moved by the difference K. With this operation, the wafer alignment mark 42 can be moved to the focus position H as the optical axis shift adjustment focus position. By acquiring the relationship between the best focus position and the optical axis shift adjustment focus position, the wafer alignment mark 42 can be easily moved to the optical axis shift adjustment focus position in a short period of time in the adjustment of the wafer alignment detection system 80 for the second and subsequent times. The method of adjusting an optical axis shift by moving the wafer alignment mark 42 from the best focus position to the optical axis shift adjustment focus position can be used either when assembling the wafer alignment detection system 80 or after mounting it in the exposure apparatus.

Although a method of adjusting the wafer alignment detection system 80 using a wafer alignment mark 42 having a step DL of $\lambda/8$ has been described in this embodiment, this method is not particularly limited to the use of a wafer alignment mark 42 having a step DL of $\lambda/8$. As long as there is an optical axis shift adjustment focus position at which the waveform asymmetry is free from the influence of coma aberration, any wafers such as a resist wafer and process wafer may be used. However, a wafer which exhibits a relatively high sensitivity to an optical axis shift is preferably used to adjust the optical axis shift with high accuracy.

Figure 29:
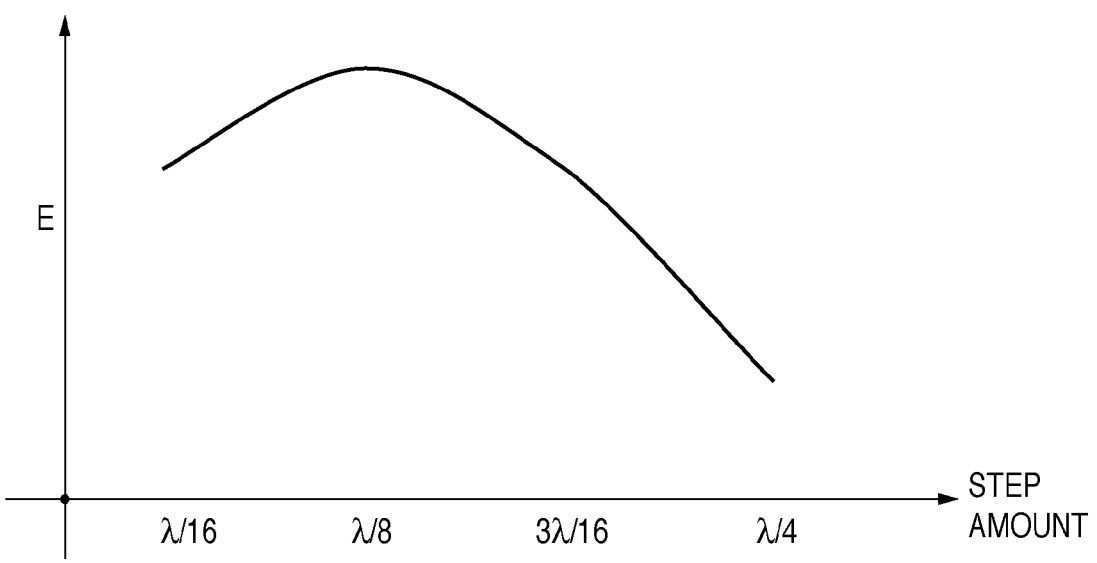
FIG. 29 is a graph showing the relationship between the waveform asymmetry of the detection waveform between its lower peaks at the optical axis shift adjustment focus position and the step amount of the wafer alignment mark.

FIG. 29 is graph showing the relationship between the waveform asymmetry E of the detection waveform between its lower peaks (the lower peaks $WU_2$ shown in FIG. 24A) at the optical axis shift adjustment focus position and the step amount of the wafer alignment mark 42. In FIG. 29, the ordinate indicates the waveform asymmetry E, and the abscissa indicates the step amount of the wafer alignment mark 42. Referring to FIG. 29, the waveform asymmetry E is highest when the step amount of the wafer alignment mark 42 is around $\lambda/8$.

In this manner, in adjusting an optical axis shift of the wafer alignment detection system 80, a wafer alignment mark 42 having a step DL of about $\lambda/8$ exhibits a highest sensitivity with respect to the optical axis shift at the lower peaks of the detection waveform. Hence, the use of a wafer alignment mark 42 having a step DL of about $\lambda/8$ allows adjusting an optical axis shift of the wafer alignment detection system 80 with high accuracy. Since the relationship of the waveform asymmetry E to the step amount of the wafer alignment mark 42 shown in FIG. 29 periodically changes, an optical axis shift can be adjusted with high accuracy using even a wafer alignment mark 42 having a step DL of an odd multiple of $\lambda/8$.

A method of adjusting the wafer alignment detection system 80 using a detection waveform when the wafer alignment mark 42 is illuminated (detected) with an illuminance σ value of 0.9 has been described in this embodiment. However, the wafer alignment mark 42 may be illuminated (detected) with any illumination σ value as long as a detection waveform having lower peaks $WU_2$ as shown in FIG. 24A can be obtained.

FIGS. 30A to 30C are graphs showing the relationships between the waveform asymmetries between the lower peaks of detection waveforms obtained by illuminating (detecting) a wafer alignment mark 42 having a step DL of λ/8 with three illumination σ values and the focus position Z of the wafer alignment mark 42. FIG. 30A shows a case in which the illumination σ value is 0.9, FIG. 30B shows a case in which the illumination σ value is 0.6, and FIG. 30C shows a case in which the illumination σ value is 0.4.

In FIGS. 30A to 30C, reference symbol E4 indicates the waveform asymmetry when the wafer alignment detection system 80 has no coma aberration but has an optical axis shift alone. Reference symbol E5 indicates the waveform asymmetry when the wafer alignment detection system 80 has coma aberration and an optical axis shift in an amount equal to that in E4. Reference symbol E6 indicates the waveform asymmetry when the wafer alignment detection system 80 has coma aberration in an amount twice that in E5 and an optical axis shift in an amount equal to that in E4.

The scales along the ordinates in FIGS. 30A to 30C are the same. Even when the waveform asymmetry E changes between different illumination σ values, there are optical axis shift adjustment focus positions for the respective illumination σ values.

Figure 31A:
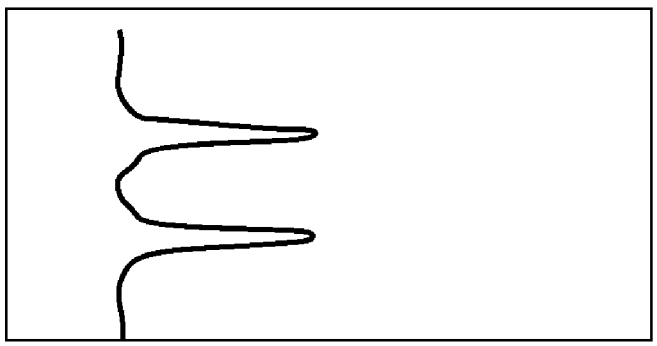
FIGS. 31A to 31C are charts showing detection waveforms when the wafer alignment detection system has illuminated (detected) the wafer alignment mark with respective illumination σ values (0.9, 0.6, and 0.4) while there is neither coma aberration nor optical axis shift (ideal state).
Figure 31B:
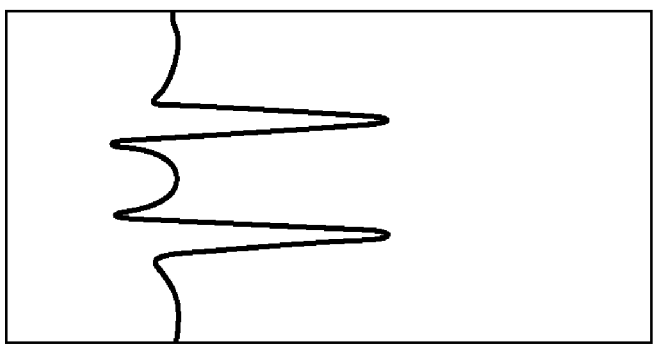
Figure 31C:
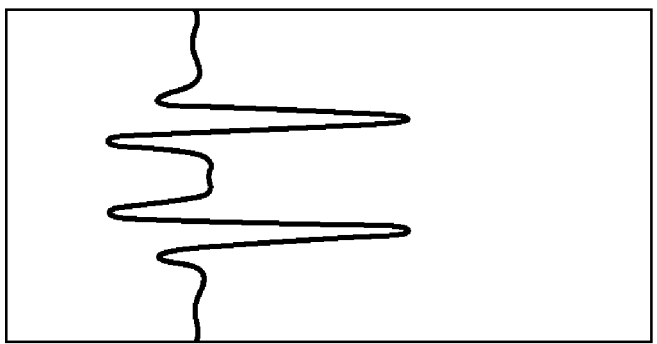

FIGS. 31A to 31C show detection waveforms when the wafer alignment detection system 80 has illuminated (detected) the wafer alignment mark 42 with respective illumination σ values (0.9, 0.6, and 0.4) while there is neither coma aberration nor optical axis shift (ideal state). FIG. 31A shows a case in which the illumination σ value is 0.9, FIG. 31B shows a case in which the illumination σ value is 0.6, and FIG. 31C shows a case in which the illumination σ value is 0.4.

Referring to FIGS. 30A to 30C and 31A to 31C, there is an optical axis shift adjustment focus position for any illumination σ value as long as a detection waveform having lower peaks $WU_2$ as shown in FIG. 24A is obtained, and then an optical axis shift can be adjusted at the optical axis shift adjustment focus position with high accuracy.

Figure 32:
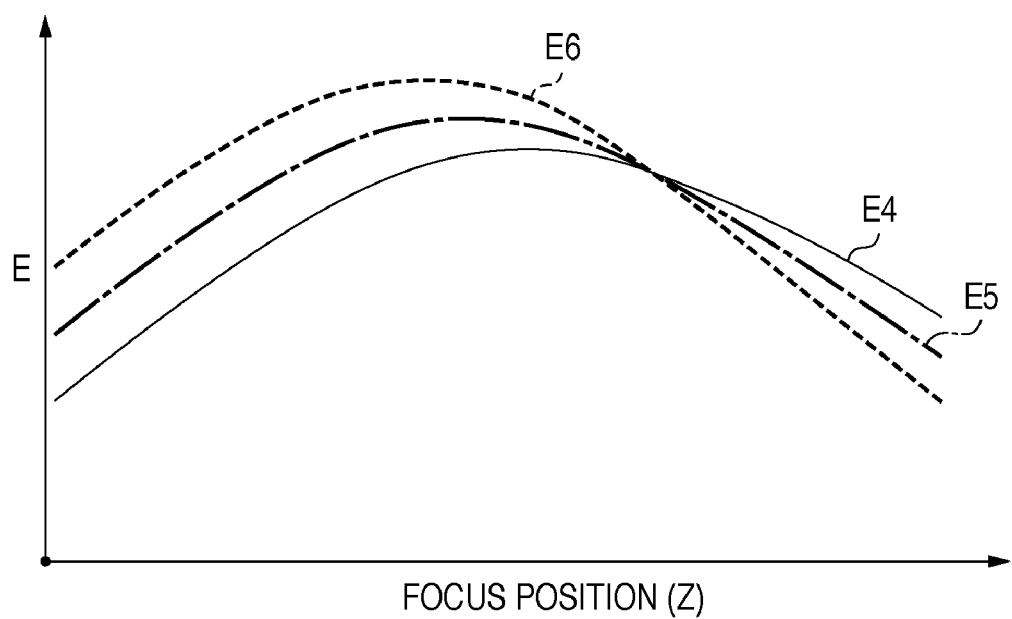
FIG. 32 is a graph showing the relationship between the waveform asymmetry between the lower peaks of a detection waveform obtained when the wafer alignment detection system illuminates (detects) the resist wafer with an illumination σ value of 0.9 and the focus position of the resist wafer.
Figure 33:
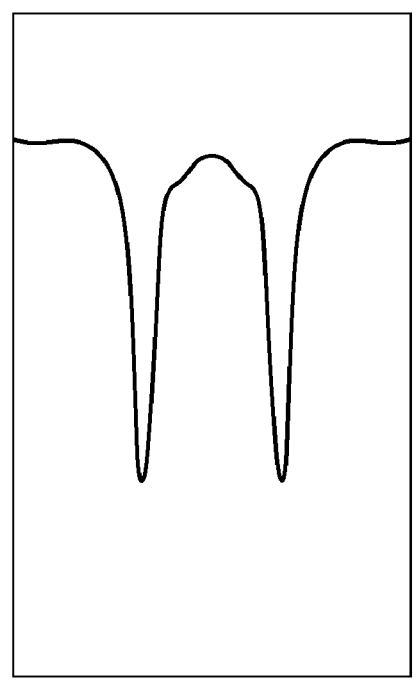
FIG. 33 is a chart showing a detection waveform when the wafer alignment detection system has illuminated (detected) the resist wafer with an illumination σ value of 0.9 while there is neither optical axis shift nor coma aberration.

Consider a case in which a resist wafer RW in which a step DL is formed on its silicon surface by a resist, as shown in FIG. 20. FIG. 32 shows the relationship between the waveform asymmetry between the lower peaks of a detection waveform obtained when the wafer alignment detection system 80 illuminates (detects) the resist wafer RW with an illumination σ value of 0.9. FIG. 33 shows a detection waveform when the wafer alignment detection system 80 has illuminated (detected) the resist wafer RW with an illumination σ value of 0.9 while there is neither coma aberration nor optical axis shift (ideal state).

In FIG. 32, reference symbol E4 indicates the waveform asymmetry when the wafer alignment detection system 80 has no coma aberration but has an optical axis shift alone. Reference symbol E5 indicates the waveform asymmetry when the wafer alignment detection system 80 has coma aberration and an optical axis shift in an amount equal to that in E4. Reference symbol E6 indicates the waveform asymmetry when the wafer alignment detection system 80 has coma aberration in an amount twice that in E5 and an optical axis shift in an amount equal to that in E4.

Referring to FIG. 32, there is an optical axis shift adjustment focus position. The adjustment method for the wafer alignment detection system 80 according to this embodiment may use a process wafer or the resist wafer RW as shown in FIG. 20 as long as a detection waveform having lower peaks $WU_2$ as shown in FIG. 24A can be obtained.

The adjustment method (i.e., optical axis shift adjustment at the optical axis shift adjustment focus position) for the wafer alignment detection system 80 according to this embodiment can be used either when assembling the wafer alignment detection system 80 or after mounting it in the exposure apparatus.

The adjustment method according to this embodiment described above is also applicable to the reticle alignment detection system 70 or 75 or the projection optical system 30, as in the wafer alignment detection system 80.

A case in which the adjustment method according to this embodiment is applied to the reticle alignment detection system 70 or projection optical system 30 will be explained below. To adjust coma aberration of the projection optical system 30 with high accuracy, it is necessary to adjust the projection optical system 30 after coma aberration and an optical axis shift of the reticle alignment detection system 70 are adjusted, as will be described later.

An adjustment method for the reticle alignment detection system 70 will be explained. A light beam which has the same wavelength as that of exposure light and is emitted by the reticle alignment detection system 70 illuminates a reticle alignment detection system adjustment mark (not shown) on the reticle 20. Reflected light, diffracted light, and scattered light from the reticle alignment detection system adjustment mark are detected by the photoelectric conversion device of the reticle alignment detection system 70. With this operation, detection waveforms as shown in FIGS. 6A and 6B can be obtained.

To obtain the relationship between the detection waveform asymmetry and the focus position of the reticle alignment detection system adjustment mark as shown in FIG. 9, the adjustment mark is defocused by driving the reticle stage 25 in the Z-axis direction. The relationship between the detection waveform asymmetry and the focus position of the adjustment mark is acquired for each of two or more pupil positions. The adjustment mark on the reticle 20 may be defocused by fixing the reticle stage 25 and driving the reticle alignment detection system 70 in the Z-axis direction, instead of defocusing the adjustment mark on the reticle 20 by driving the reticle stage 25.

As the relationships between the detection waveform asymmetry and the focus position of the reticle alignment detection system adjustment mark are obtained, the adjustment mark is moved to a coma aberration adjustment focus position at which the waveform asymmetry is free from the influence of an optical axis shift of the reticle alignment detection system 70. Coma aberration of the reticle alignment detection system 70 is adjusted at the coma aberration adjustment focus position. More specifically, an optical member to adjust coma aberration of the reticle alignment detection system 70 is driven in a direction perpendicular to the optical axis so that the waveform asymmetry becomes zero.

As the coma aberration of the reticle alignment detection system 70 is adjusted, the adjustment mark is defocused from the coma aberration adjustment focus position, and an optical axis shift of the reticle alignment detection system 70 is adjusted based on the waveform asymmetry. More specifically, an aperture stop or light source set on the pupil plane (the optical Fourier transformation plane with respect to the object plane) of an optical system of the reticle alignment detection system 70 is driven in a direction perpendicular to the optical axis so that the waveform asymmetry becomes zero.

In this manner, coma aberration and an optical axis shift of the reticle alignment detection system 70 can be adjusted independently (separately) with high accuracy. An optical axis shift of the reticle alignment detection system 70 may be adjusted based on the waveform asymmetry or by using the position shift amount of the adjustment mark with respect to the defocus as a reference. When the position shift amount is used as a reference, an optical axis shift is adjusted so that the detection waveform of the adjustment mark at each focus position upon defocusing the adjustment mark stays constant independently of the focus position.

In the above description, an optical axis shift of the reticle alignment detection system 70 is adjusted after coma aberration of the reticle alignment detection system 70 is adjusted at the coma aberration adjustment focus position. However, coma aberration of the reticle alignment detection system 70 may be adjusted after an optical axis shift of the reticle alignment detection system 70 is adjusted at an optical axis shift adjustment focus position at which the waveform asymmetry is free from the influence of the optical axis shift.

When coma aberration and an optical axis shift of the reticle alignment detection system 70 are adjusted with high accuracy, coma aberration of the projection optical system 30 can be adjusted using the light source of the reticle alignment detection system 70.

An adjustment method for the projection optical system 30 will be explained. A light beam which has the same wavelength as that of exposure light and is emitted by the reticle alignment detection system 70 in which coma aberration and an optical axis shift are adjusted perfectly illuminates a projection optical system adjustment mark (not shown) on the stage reference plate 50 upon passing through the reticle 20 and projection optical system 30. Reflected light, diffracted light, and scattered light from the projection optical system adjustment mark are detected by the photoelectric conversion device of the reticle alignment detection system 70. With this operation, detection waveforms as shown in FIGS. 6A and 6B can be obtained. If the obtained detection waveform is asymmetrical, the detection waveform asymmetry has occurred due to coma aberration or an optical axis shift of the projection optical system 30 because coma aberration and an optical axis shift of the reticle alignment detection system 70 have been adjusted perfectly.

To obtain the relationship between the detection waveform asymmetry and the focus position of the projection optical system adjustment mark as shown in FIG. 9, the adjustment mark is defocused by driving the wafer stage 45 in the Z-axis direction. The relationship between the detection waveform asymmetry and the focus position of the adjustment mark is acquired for each of two or more pupil positions. The adjustment mark on the stage reference plate 50 may be defocused by fixing the wafer stage 45 and driving the reticle alignment detection system 70 in the Z-axis direction, instead of defocusing the adjustment mark on the stage reference plate 50 by driving the wafer stage 45.

As the relationships between the detection waveform asymmetry and the focus position of the projection optical system adjustment mark are obtained, the adjustment mark is moved to a coma aberration adjustment focus position at which the waveform asymmetry is free from the influence of an optical axis shift of the projection optical system 30. Coma aberration of the projection optical system 30 is adjusted at the coma aberration adjustment focus position. More specifically, an optical member to adjust coma aberration of the projection optical system 30 is driven in a direction perpendicular to the optical axis so that the waveform asymmetry becomes zero.

As the coma aberration of the projection optical system 30 is adjusted, the adjustment mark is defocused from the coma aberration adjustment focus position, and an optical axis shift of the projection optical system 30 is adjusted based on the waveform asymmetry. An optical axis shift of the projection optical system 30 is adjusted by driving an aperture stop or light source of the reticle alignment detection system 70 inserted at a position conjugate to the pupil plane (the optical Fourier transformation plane with respect to the object plane) of projection optical system 30, instead of driving the optical member of the projection optical system 30. In other words, the aperture stop or light source of the reticle alignment detection system 70 is driven in a direction perpendicular to the optical axis so that the overall optical axis shift of the reticle alignment detection system 70 and projection optical system 30 becomes zero.

In this manner, coma aberration of the projection optical system 30 and the overall optical axis shift of the reticle alignment detection system 70 and projection optical system 30 can be adjusted independently (separately) with high accuracy. The overall optical axis shift of the reticle alignment detection system 70 and projection optical system 30 may be adjusted based on the waveform asymmetry or by using the position shift amount of the adjustment mark with respect to the defocus as a reference.

In the above description, the overall optical axis shift of the reticle alignment detection system 70 and projection optical system 30 is adjusted after coma aberration of the projection optical system 30 is adjusted at the coma aberration adjustment focus position. However, coma aberration of the projection optical system 30 may be adjusted after an optical axis shift of the projection optical system 30 is adjusted at an optical axis shift adjustment focus position at which the waveform asymmetry is free from the influence of the optical axis shift.

As described above, to adjust the projection optical system 30 with high accuracy, it is necessary to adjust the projection optical system 30 with a light beam from the reticle alignment detection system 70 in which coma aberration and an optical axis shift are adjusted perfectly. If the projection optical system 30 is adjusted with a light beam from the reticle alignment detection system 70 in which coma aberration and an optical axis shift are adjusted imperfectly, it cannot be determined whether the detection waveform asymmetry is attributed to the projection optical system 30 or reticle alignment detection system 70. This makes it impossible to adjust coma aberration of the projection optical system 30 with high accuracy.

The adjustment methods for the reticle alignment detection system 70 and projection optical system 30 described above can be used either when assembling the reticle alignment detection system 70 and projection optical system 30 or after mounting it in the exposure apparatus.

The adjustment method according to this embodiment can independently (separately) adjust coma aberration and an optical axis shift of an optical system with high accuracy in a position detection apparatus such as the reticle alignment detection system 70 and wafer alignment detection system 80. Hence, the use of the reticle alignment detection system 70 and wafer alignment detection system 80 adjusted in this embodiment allows aligning the reticle 20 and wafer 40 with high accuracy by reducing detection errors in wafer processes under various conditions. Consequently, the exposure apparatus 1 can perform exposure with high overlay accuracy.

In the operation of the exposure apparatus 1, the reticle alignment detection system 70 and wafer alignment detection system 80 are adjusted first. As described above, coma aberration and an optical axis shift of each of the reticle alignment detection system 70 and wafer alignment detection system 80 are adjusted with high accuracy (perfectly) using the adjustment method according to this embodiment. At this time, coma aberration of the projection optical system 30 may be adjusted using the reticle alignment detection system 70 in which coma aberration and an optical axis shift are adjusted with high accuracy.

The reticle 20 and wafer 40 are aligned using the reticle alignment detection system 70 and wafer alignment detection system 80 in each of which coma aberration and an optical axis shift are adjusted with high accuracy. Since the reticle alignment detection system 70 and wafer alignment detection system 80 have neither coma aberrations nor optical axis shifts, the reticle 20 and wafer 40 are aligned with high accuracy.

The pattern of the reticle 20 is transferred onto the wafer 40 by exposure. A light beam emitted by the light source 12 illuminates the reticle 20 via the illumination optical system 14. A light component reflecting the pattern of the reticle 20 forms an image on the wafer 40 via the projection optical system 30. Since the reticle 20 and wafer 40 are aligned with high accuracy, the pattern of the reticle 20 can be transferred onto the wafer 40 by exposure with high overlay accuracy. Since the projection optical system 30 is also adjusted with high accuracy, it attains an excellent imaging performance. Hence, the exposure apparatus 1 can provide devices (e.g., a semiconductor device, an LCD device, an image sensing device (e.g., a CCD), and a thin-film magnetic head) with high throughput, high quality, and a good economical efficiency. These devices are fabricated by a step of exposing a substrate (e.g., a wafer or glass plate) coated with a resist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-180152 filed on Jul. 9, 2007, which is hereby incorporated by reference herein in its entirety.

What is claimed is:

1. An adjustment method for a position detection apparatus which comprises an optical system including a first optical member and a second optical member whose positions can be changed, and is configured to detect a position of a detection object, comprising the steps of:
    setting a plurality of different positions to position the first optical member in a direction perpendicular to an optical axis of the optical system;
    detecting light from the detection object via the optical system, while relatively moving the detection object in a direction of the optical axis of the optical system, for each of the plurality of positions set in the step of setting;
    calculating an evaluation value related to an asymmetry of a detection signal of the light, which is detected in the step of detecting, for each of the plurality of positions;
    specifying a position of the detection object in the direction of the optical axis of the optical system, at which the evaluation value calculated in the step of calculating is insensitive, for each of the plurality of positions; and
    adjusting a position of the second optical member, in a state where the detection object is positioned at the position specified in the step of specifying, by driving the second optical member in the direction perpendicular to the optical axis of the optical system so that a detection signal of the light from the detection object becomes symmetrical.

2. The method according to claim 1, further comprising the step of moving, using a contrast of the detection signal as a reference, the detection object to the position of the detection object in the direction of the optical axis of the optical system specified in the step of specifying.

3. The method according to claim 1, further comprising the step of moving, using as a reference a position at which a contrast of the detection signal is maximum, the detection object to the position of the detection object in the direction of the optical axis of the optical system specified in the step of specifying.

4. The method according to claim 1, further comprising the step of adjusting a position of the first optical member, in a state where the detection object is positioned at a position which is different from the position specified in the step of specifying, by driving the first optical member in the direction perpendicular to the optical axis of the optical system so that a detection signal of the light from the detection object becomes symmetrical.

5. The method according to claim 4, wherein
    the first optical member includes one of a light source configured to emit light to illuminate the detection object, and an aperture stop inserted on a pupil plane of the optical system,
    the second optical member includes an optical member configured to adjust an aberration of the optical system,
    in the step of setting, a plurality of different optical axis shifts are set by setting a position of the one of the light source and the aperture stop in the direction perpendicular to the optical axis of the optical system,
    in the step of adjusting a position of the second optical member, an aberration of the optical system is adjusted by driving the optical member configured to adjust an aberration of the optical system in the direction perpendicular to the optical axis of the optical system, and
    in the step of adjusting a position of the first optical member, an optical axis shift of the optical system is adjusted by driving the one of the light source and the aperture stop in the direction perpendicular to the optical axis of the optical system.

6. The method according to claim 4, wherein
    the first optical member includes an optical member configured to adjust an aberration of the optical system,
    the second optical member includes one of a light source configured to emit light to illuminate the detection object, and an aperture stop inserted on a pupil plane of the optical system,
    in the step of setting, a plurality of different aberrations are set by setting a position of the optical member configured to adjust an aberration of the optical system in the direction perpendicular to the optical axis of the optical system,
    in the step of adjusting a position of the second optical member, an optical axis shift of the optical system is adjusted by driving the one of the light source and the aperture stop in the direction perpendicular to the optical axis of the optical system, and
    in the step of adjusting a position of the first optical member, an aberration of the optical system is adjusted by driving the optical member configured to adjust an aberration of the optical system in the direction perpendicular to the optical axis of the optical system.

7. The method according to claim 5, wherein in the step of adjusting a position of the second optical member, the optical member configured to adjust an aberation of the optical system is driven by a driving unit.

8. The method according to claim 5, wherein letting $\lambda$ be a wavelength of light illuminating the detection object, the detection object has a step of an odd multiple of $\lambda/4$.

9. The method according to claim 6, wherein in the step of adjusting a position of the second optical member, one of the light source and the aperture stop is driven by a driving unit.

10. The method according to claim 6, wherein letting λ be a wavelength of light illuminating the detection object, the detection object has a step of an odd multiple of λ/8.

11. An exposure apparatus comprising:
an illumination optical system configured to illuminate a reticle with a light beam from a light source;
a projection optical system configured to project a pattern of the reticle onto a substrate; and
a position detection apparatus which comprises an optical system including a first optical member and second optical member whose positions can be changed, and is configured to detect at least one of a position of the reticle and a position of the substrate,
the position detection apparatus comprising:
a setting unit configured to set a plurality of different positions to position the first optical member in a direction perpendicular to an optical axis of the optical system;
a detection unit configured to detect, while relatively moving a mark representing the at least one of the position of the reticle and the position of the substrate in a direction of the optical axis of the optical system, light from the mark, for each of the plurality of positions set by the setting unit;
a calculation unit configured to calculate an evaluation value related to an asymmetry of a detection signal of the light, which is detected by the detection unit, for each of the plurality of positions;
a specifying unit configured to specify a position of the mark in the direction of the optical axis of the optical system, at which the evaluation value calculated by the calculation unit is insensitive, for each of the plurality of positions; and
an adjusting unit configured to adjust a position of the second optical member, in a state where the mark is positioned at the specified position, by driving the second optical member in the direction perpendicular to the optical axis of the optical system so that a detection signal of the light from the mark becomes symmetrical.

12. A device fabrication method comprising the steps of:
exposing a substrate using an exposure apparatus according to claim 11; and
performing a development process for the substrate exposed.

13. A position detection apparatus comprising:
an optical system including a first optical member and a second optical member whose positions can be changed, and is configured to detect a position of a detection object;
a setting unit configured to set a plurality of different positions to position the first optical member in a direction perpendicular to an optical axis of the optical system;
a detection unit configured to detect light from the detection object via the optical system, while relatively moving the detection object in a direction of the optical axis of the optical system, for each of the plurality of positions set by the setting unit;
a calculation unit configured to calculate an evaluation value related to an asymmetry of a detection signal of the light, which is detected by said the detection unit, for each of the plurality of positions;
a specifying unit configured to specify a position of the detection object in the direction of the optical axis of the optical system, at which the evaluation value calculated by the calculation unit is insensitive, for each of the plurality of positions; and
an adjusting unit configured to adjust a position of the second optical member, in a state where the detection object is positioned at the specified position, by driving the second optical member in the direction perpendicular to the optical axis of the optical system so that a detection signal of the light from the detection object becomes symmetrical.

14. An adjustment method for a position detection apparatus which comprises an optical system including a first optical member and a second optical member whose positions can be changed, and is configured to detect a position of a detection object, comprising the steps of:
setting a plurality of different positions to position the first optical member in a direction perpendicular to an optical axis of the optical system;
detecting light from the detection object via the optical system, while relatively moving the detection object in a direction of the optical axis of the optical system, for each of the plurality of positions set in the step of setting;
calculating an evaluation value related to a waveform of a detection signal of the light, which is detected in the step of detecting, for each of the plurality of positions;
specifying a position of the detection object in the direction of the optical axis of the optical system, at which the evaluation value calculated in the step of calculating is insensitive, for each of the plurality of positions; and
adjusting a position of the second optical member, in a state where the detection object is positioned at the position specified in the step of specifying, by driving the second optical member in the direction perpendicular to the optical axis of the optical system so that a detection signal of the light from the detection object becomes symmetrical.

15. An exposure apparatus comprising:
an illumination optical system configured to illuminate a reticle with a light beam from a light source;
a projection optical system configured to project a pattern of the reticle onto a substrate; and
a position detection apparatus which comprises an optical system including a first optical member and a second optical member whose positions can be changed, and is configured to detect at least one of a position of the reticle and a position of the substrate,
the position detection apparatus comprising:
a setting unit configured to set a plurality of different positions to position the first optical member in a direction perpendicular to an optical axis of the optical system;
a detection unit configured to detect, while relatively moving a mark representing the at least one of the position of the reticle and the position of the substrate in a direction of the optical axis of the optical system, light from the mark, for each of the plurality of positions set by the setting unit;
a calculation unit configured to calculate an evaluation value related to a waveform of a detection signal of the light, which is detected by the detection unit, for each of the plurality of positions;
a specifying unit configured to specify a position of the mark in the direction of the optical axis of the optical system, at which the evaluation value calculated by the calculation unit is insensitive, for each of the plurality of positions; and
an adjusting unit configured to adjust a position of the said second optical member, in a state where the mark is positioned at the specified position, by driving the second optical member in the direction perpendicular to the optical axis of the optical system so that a detection signal of the light from the mark becomes symmetrical.

* * * * *